US008815619B2

(12) United States Patent
Arai et al.

(10) Patent No.: US 8,815,619 B2
(45) Date of Patent: Aug. 26, 2014

(54) METHOD OF MANUFACTURING DISPLAY UNIT

(75) Inventors: Toshiaki Arai, Kanagawa (JP); Takashige Fujimori, Kanagawa (JP)

(73) Assignee: Sony Corporation, Tokyo (JP)

( * ) Notice: Subject to any disclaimer, the term of this patent is extended or adjusted under 35 U.S.C. 154(b) by 83 days.

(21) Appl. No.: 13/613,337

(22) Filed: Sep. 13, 2012

(65) Prior Publication Data

US 2013/0089940 A1    Apr. 11, 2013

(30) Foreign Application Priority Data

Oct. 6, 2011  (JP) .................................. 2011-221980

(51) Int. Cl.
*H01L 21/00* (2006.01)
*H01L 29/10* (2006.01)

(52) U.S. Cl.
USPC ................. 438/34; 438/73; 438/85; 438/104; 257/59; 257/72

(58) Field of Classification Search
CPC . H01L 29/7869; H01L 27/3244; H01L 51/56; H01L 21/02565; H01L 29/4908
USPC ........ 438/34, 73, 82, 85, 99, 104; 257/40, 43, 257/59, 72, 98
See application file for complete search history.

(56) References Cited

U.S. PATENT DOCUMENTS 8,450,144 B2 * 5/2013 Sakata et al. .................. 438/104

FOREIGN PATENT DOCUMENTS

JP           4470029         3/2010

\* cited by examiner

*Primary Examiner* — Hsien Ming Lee
(74) *Attorney, Agent, or Firm* — Dentons US LLP

(57) ABSTRACT

A method of manufacturing a display unit includes: forming, on a substrate, a thin-film transistor having an oxide semiconductor layer; and forming, above the thin-film transistor, a display region that includes a plurality of display elements. The oxide semiconductor layer is formed using a sputtering method in which a target and the substrate are opposed to each other. The target is made of an oxide semiconductor and includes a plurality of divided portions that are jointed in a planar form. A spacing interval between two joints that are formed by the plurality of divided portions and are side-by-side with one another of the target is equal to or less than a width of a luminance distribution arising in the display region in a direction substantially orthogonal to the joints.

6 Claims, 22 Drawing Sheets

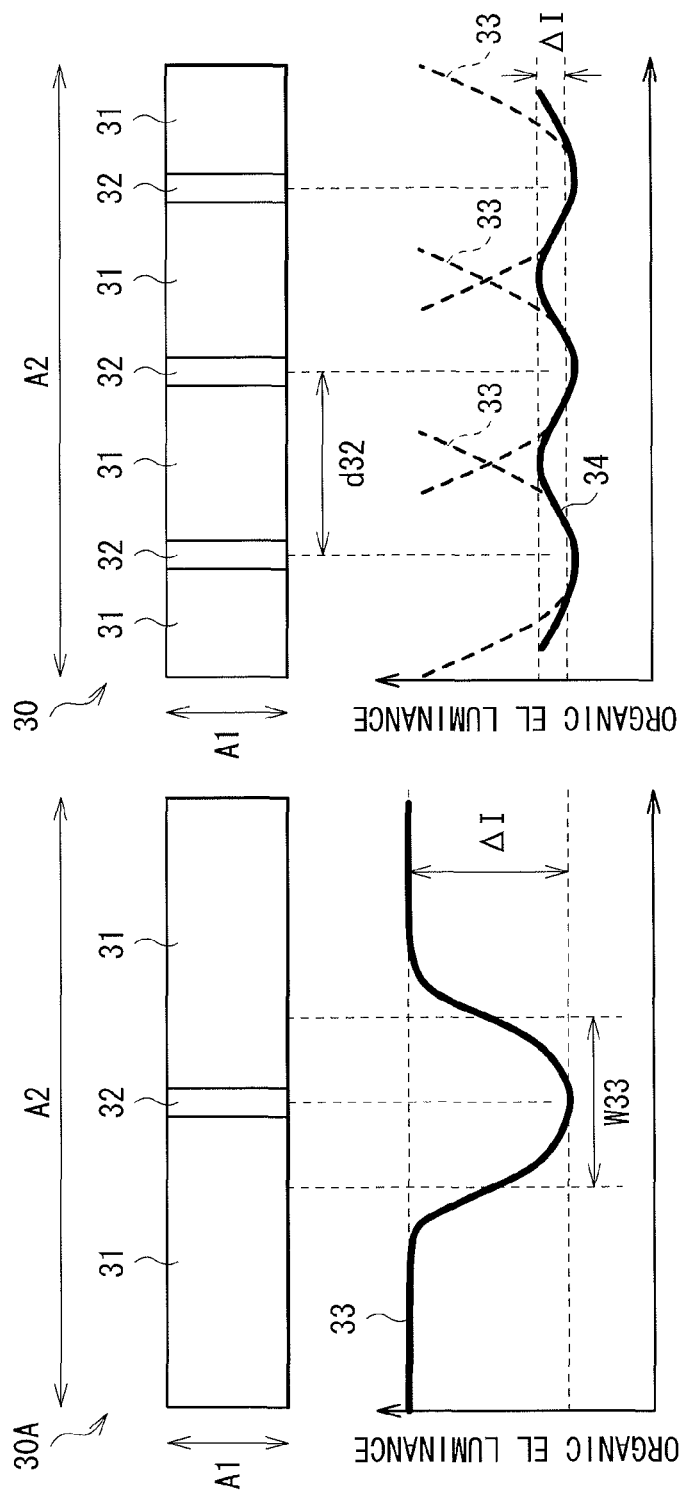

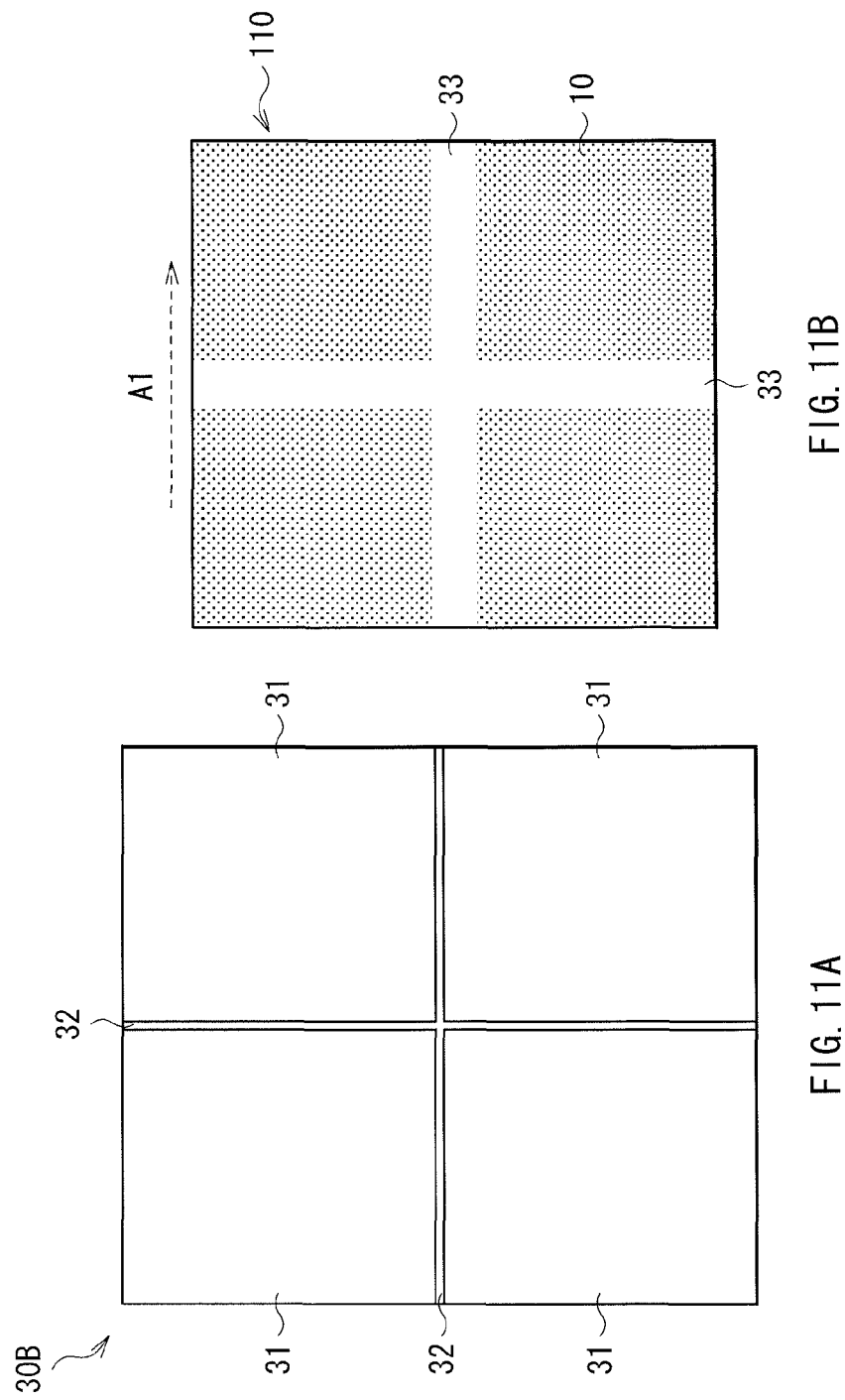

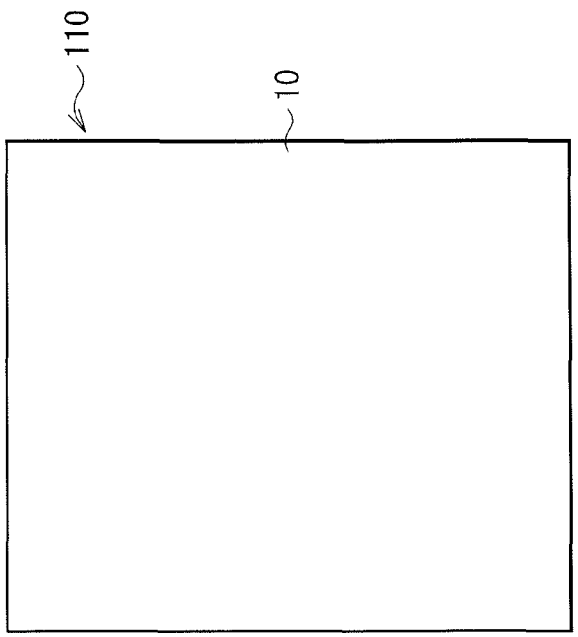
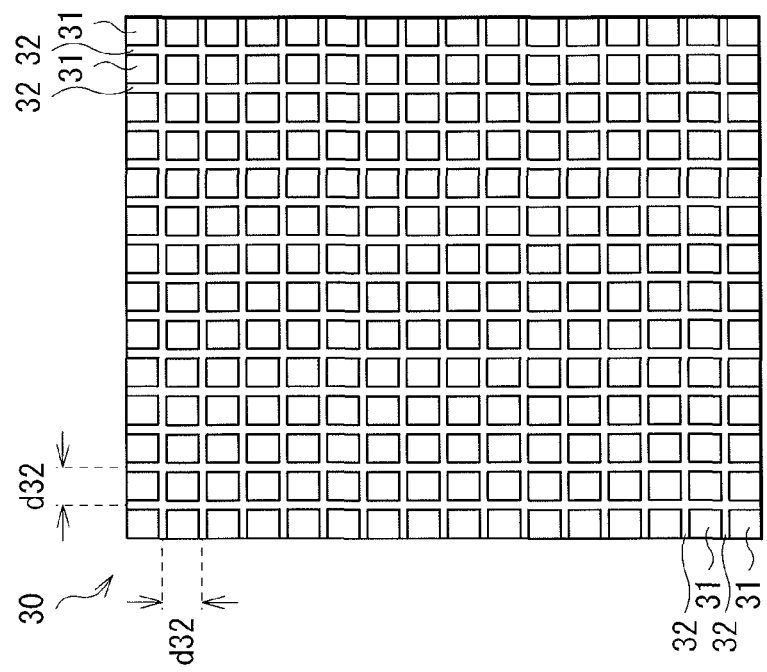
FIG. 12A
FIG. 12B

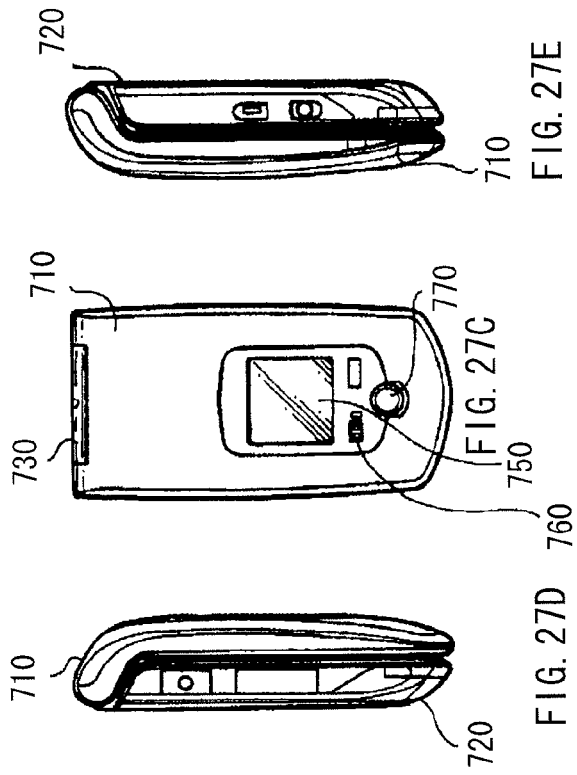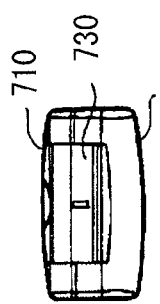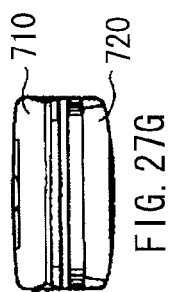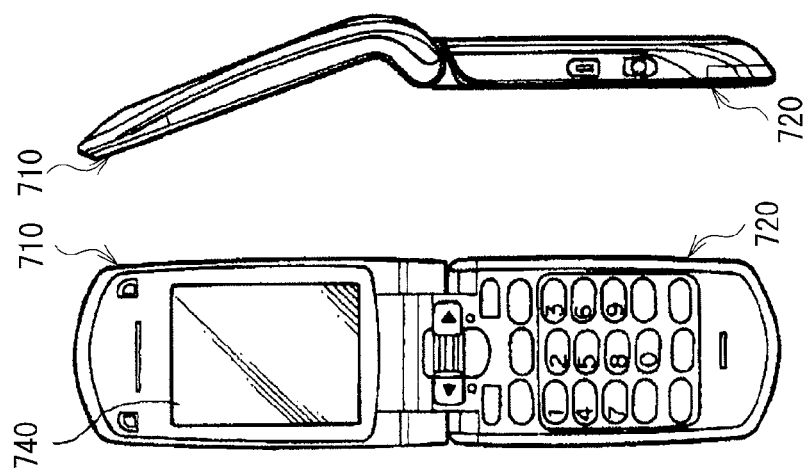

METHOD OF MANUFACTURING DISPLAY UNIT

BACKGROUND

The present disclosure relates to a method of manufacturing a display unit that includes a TFT (Thin-Film Transistor) having an oxide semiconductor layer as a channel.

An oxide (oxide semiconductor) of zinc, indium, gallium, tin, or a mixture of these element compounds is known for a material exhibiting excellent semiconductor characteristics. Accordingly, in recent years, the oxide semiconductor has been actively researched for application thereof to a TFT acting as a driving element for an active-matrix display unit.

A sputtering method is typically used for the formation of an oxide semiconductor layer. The sputtering method has the advantages of being capable of depositing a film on a large-sized substrate or reducing process temperature, being able to utilize existing equipment in use for a silicon (Si)-based TFT manufacturing line, and other benefits.

As with ITO (indium tin oxide) that is a transparent electrode material, however, an oxide semiconductor target for sputtering is a material having difficulty in manufacturing a large-sized target. Therefore, a target in use for large-sized sputtering equipment is divided, resulting in a joint being found. For sputtering of ITO, an abnormal electric discharge caused by a particle arising due to reattachment of a sputtered particulate on the top surface of a target, or a nodule (black-color protrusion being formed on the top surface of a target during sputtering) is known as an issue. When a joint is present at an erosion region (region to which a voltage is applied during sputtering), it is more likely that a particle and the like will occur at an end of a joint especially. For an ITO division target, to suppress this, an adjustment of a density, dimension, surface roughness, and the like of a target has been attempted (for example, see Japanese Patent No. 4470029).

SUMMARY

For a TFT utilizing an oxide semiconductor, it is less likely that a particle on a joint that is found in the ITO division target will come to an issue, whereas electrical characteristics thereof vary significantly depending on a film quality of an oxide semiconductor layer such as film density, film thickness, or constituent elements. Consequently, use of a divided target gives rise to variations in the characteristics of a TFT. In particular, for an organic EL display unit, the luminance thereof varies sensitively depending on electrical characteristics of a TFT to drive each pixel, and thus there is an issue that a local difference in the characteristics leads to luminance unevenness.

It is desirable to provide a method of manufacturing a display unit that is capable of reducing the luminance unevenness.

A method of manufacturing a display unit according to an embodiment of the present disclosure includes: forming, on a substrate, a thin-film transistor having an oxide semiconductor layer; and forming, above the thin-film transistor, a display region that includes a plurality of display elements. The oxide semiconductor layer is formed using a sputtering method in which a target and the substrate are opposed to each other. The target is made of an oxide semiconductor and includes a plurality of divided portions that are jointed in a planar form. A spacing interval between two joints that are formed by the plurality of divided portions and are side-by-side with one another of the target is equal to or less than a width of a luminance distribution arising in the display region in a direction substantially orthogonal to the joints.

In the method of manufacturing the display unit according to the above-described embodiment of the present disclosure, the thin-film transistor having the oxide semiconductor layer is formed on the substrate, following which the display region including the plurality of display elements is formed above the thin-film transistor. The oxide semiconductor layer is formed using a sputtering method in which the target and the substrate are opposed to each other. The target includes the plurality of divided portions that are jointed in a planar form, and has the joint at a boundary line of the adjoining divided portions. As a result, in the display region on the substrate, the luminance distribution (a region different from any other region in the luminance) is generated in the direction substantially orthogonal to the joint, at a location in opposition to the joint and at a region in the vicinity of such location.

Here, the spacing interval between the two joints that are formed by the plurality of divided portions and are side-by-side with one another of the target is made equal to or less than the width of this luminance distribution. Accordingly, in the display region, the luminance distribution is generated at the location in opposition to each joint and at the region in the vicinity of such location, and such a luminance distribution is superposed, resulting in the luminance distribution as a whole display region being planarized to achieve uniform emission of light.

In the method of manufacturing the display unit according to the above-described embodiment of the present disclosure, the spacing interval between the two joints that are formed by the plurality of divided portions and are side-by-side with one another of the target is equal to or less than the width of the luminance distribution arising in the display region in the direction substantially orthogonal to the joints. Hence, it is possible to reduce the luminance unevenness.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the present disclosure, and are incorporated in and constitute a part of this specification. The drawings illustrate embodiments and, together with the specification, serve to explain the principles of the present technology.

FIG. 9A is a diagram for explaining the luminance unevenness arising at a display region when the two-division target illustrated in FIG. 8A is used, and FIG. 9B is a diagram for explaining the luminance unevenness arising at a display region when the target illustrated in FIG. 6 is used.

FIG. 11A is a plan view showing an example of a sheet type four-division target, and FIG. 11B is a schematic diagram showing a state of the luminance unevenness arising on a display unit that is formed using the four-division target illustrated in FIG. 11A.

FIG. 12A is a plan view showing an example of a sheet type target according to an embodiment of the present disclosure, and FIG. 12B is a schematic diagram showing a state of the luminance unevenness arising on a display unit that is formed using the target illustrated in FIG. 12A.

FIG. 24A is a perspective view showing an external appearance of an application example 4 that is viewed from the front side thereof, while

FIG. 27A is a front view of an application example 7 in an open state, FIG. 27B is a side view thereof, FIG. 27C is a front view in a closed state, FIG. 27D is a left-side view, FIG. 27E is a right-side view, FIG. 27F is a top view, and FIG. 27G is a bottom view.

DETAILED DESCRIPTION

Hereinafter, embodiments of the present disclosure are described in details with reference to the drawings. It is to be noted that the descriptions are provided in the order given below.
1. First embodiment (organic EL display unit)
2. Second embodiment (liquid crystal display unit)
3. Third embodiment (electrophoretic display unit)
4. Application examples

FIRST EMBODIMENT

Figure 1:
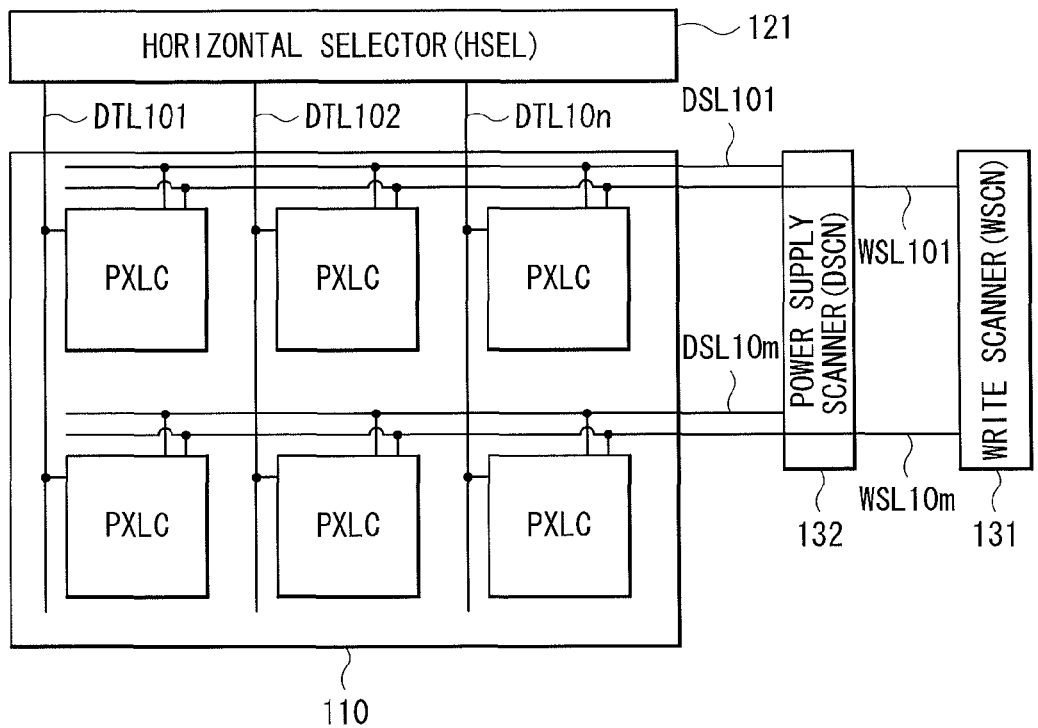
FIG. 1 is a diagram showing a configuration of a display unit according to a first embodiment of the present disclosure.

FIG. 1 shows a configuration of a display unit according to a first embodiment of the present disclosure. This display unit, which is used as an ultrathin-type organic light-emitting color display unit and the like, is provided with, for example, a display region 110 where pixels PXLC composed of a plurality of organic light-emitting elements 10R, 10G, and 10B to be hereinafter described as display elements are disposed in a matrix pattern on a TFT substrate 1 to be hereinafter described. At the periphery of the display region 110, there are disposed a horizontal selector (HSEL) 121 that is a signal section, a write scanner (WSCN) 131 and a power supply scanner (DSCN) 132 that are scanner sections.

At the display region 110, signal lines DTL 101 to 10$n$ are disposed in a column direction, while scan lines WSL 101 to 10$m$ and power supply lines DSL 101 to 10$m$ are disposed in a row direction. At a crossing point of each of the signal lines DTL and each of the scan lines WSL, there is provided a pixel circuit 140 including the organic light-emitting element PXLC (any one of 10R, 10G, and 10B (sub-pixel)). Each of the signal lines DTL is connected with the horizontal selector 121, from which an image signal is provided to the signal lines DTL. Each of the scan lines WSL is connected with the write scanner 131. Each of the power supply lines DSL is connected with the power supply scanner 132.

Figure 2:
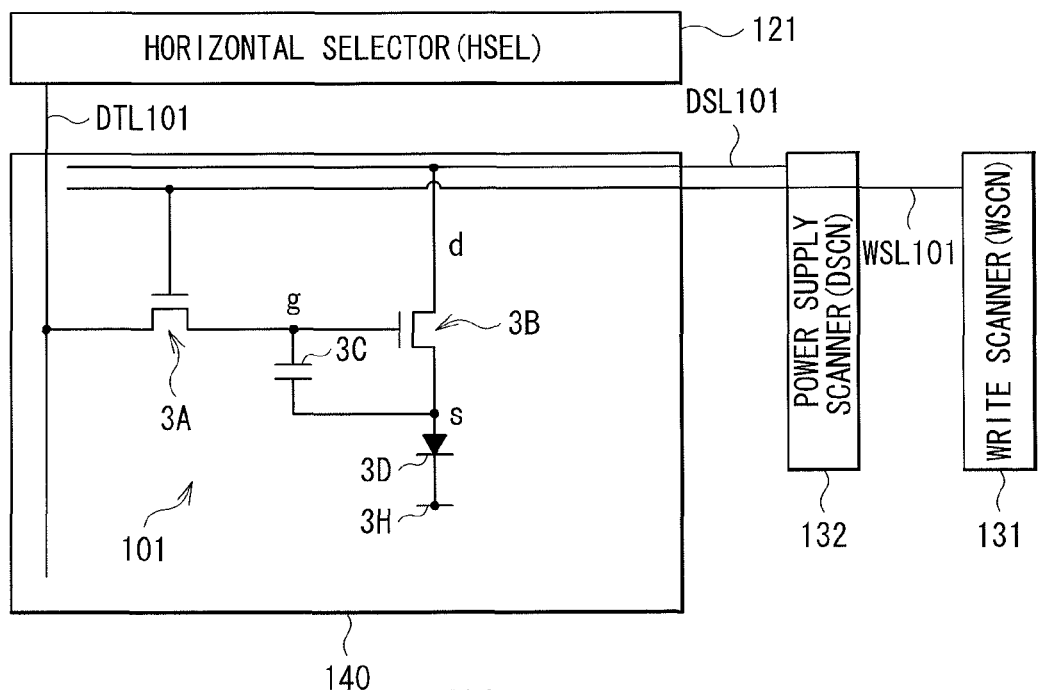
FIG. 2 is an equivalent circuit diagram showing an example of a pixel driving circuit illustrated in FIG. 1.

FIG. 2 shows an example of the pixel circuit 140. The pixel circuit 140 is an active-type driving circuit having a sampling transistor 3A and a driving transistor 3B, a holding capacitor 3C, and a light-emitting element 3D composed of the organic light-emitting element PXLC. On the sampling transistor 3A, a gate thereof is connected with the corresponding scan line WSL 101, and one of a source and a drain thereof is connected with the corresponding signal line DTL 101, while the other is connected with a gate "g" of the driving transistor 3B. On the driving transistor 3B, a drain "d" thereof is connected with the corresponding power supply line DSL 101, while a source "s" thereof is connected with an anode of the light-emitting element 3D. A cathode of the light-emitting element 3D is connected with a grounding wire 3H. It is to be noted that the grounding wire 3H is wired in common for all the pixels PXLC. The holding capacitor 3C is connected across the source s and the gate g of the driving transistor 3B.

The sampling transistor 3A, which is put in a conducting state according to a control signal provided from the scan line WSL 101, samples a signal potential of an image signal provided from the signal line DTL 101 to hold the sampled potential on the holding capacitor 3C. The driving transistor 3B receives a current supplied from the power supply line DSL 101 that is at a first potential, and provides a driving current to the light-emitting element 3D in accordance with a signal potential held on the holding capacitor 3C. The light-emitting element 3D emits light with the luminance in accordance with a signal potential of an image signal on the basis of the provided driving current.

Figure 3:
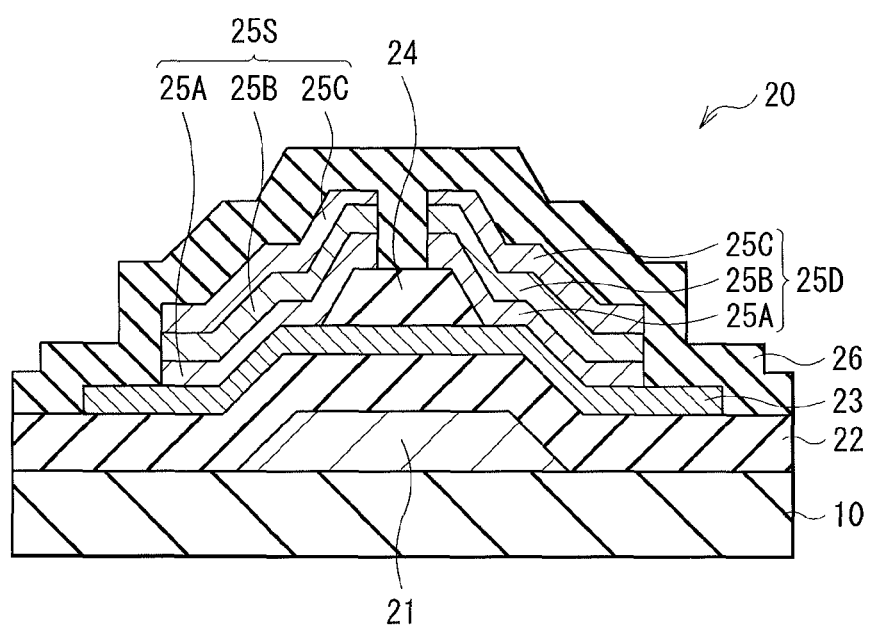
FIG. 3 is a cross-sectional diagram showing a structure of a TFT illustrated in FIG. 2.

FIG. 3 shows a cross-sectional structure of a TFT 20 composing the sampling transistor 3A and the driving transistor 3B that are illustrated in FIG. 2. For example, the TFT 20 is an oxide semiconductor transistor having a gate electrode 21, a gate insulating film 22, an oxide semiconductor layer 23, a channel protective layer 24, a source electrode 25S and a drain electrode 25D, as well as a passivation film 26 in this order on the substrate 10. Here, an oxide semiconductor refers to, for example, an oxide of zinc, indium, gallium, tin, or a mixture of these element compounds, and is known for a material exhibiting excellent semiconductor characteristics.

The gate electrode 21, which controls the electron density in the oxide semiconductor layer 23 on the basis of a gate voltage applied to the TFT 20, has, for example, a two-layer structure including a molybdenum (Mo) layer with a thickness of about 50 nm and an aluminum (Al) layer or an aluminum alloy layer with a thickness of about 400 nm. An example of the aluminum alloy layer includes an aluminum-neodymium alloy layer.

Each of the gate insulating film 22, the channel protective layer 24, and the passivation film 26, which has, for example, a thickness of not less than about 50 nm nor more than about 1 μm, is composed of a single-layer film or a multilayer film such as silicon dioxide film, silicon nitride film, silicon oxynitride film, hafnium oxide film, aluminum oxide film, tantalum oxide film, zirconium oxide film, hafnium oxide nitride film, aluminum oxide nitride film, tantalum oxide nitride film, and zirconium oxide nitride film, for example.

The oxide semiconductor layer 23, which has, for example, a thickness of not less than about 20 nm or more than about 100 nm, is composed of indium gallium zinc oxide (IGZO (In—Ga—Zn-Oxide)). Alternatively, as a constituent material of the oxide semiconductor layer 23, other oxide semiconductor materials such as ITZO, IGO, and ZnO may be used apart from the IGZO.

The source electrode 25S and the drain electrode 25D are composed of metal such as molybdenum, aluminum, and titanium, or a multilayer film of such metal. As a specific configuration of the source electrode 25S and the drain electrode 25D, for example, a multilayer film laminating a titanium layer 25A with a thickness of about 50 nm, an aluminum layer 25B with a thickness of about 200 nm to 1 μm, and a titanium layer 25C with a thickness of about 50 nm in this order from the oxide semiconductor layer 23 side is preferable. It is to be noted that, depending on use and application of the TFT 20, it is also possible to configure the source electrode 25S and the drain electrode 25D as a multilayer film laminating a molybdenum layer, an aluminum layer, and a molybdenum layer, or a multilayer film laminating a molybdenum layer, an aluminum layer, and a titanium layer.

Figure 4:
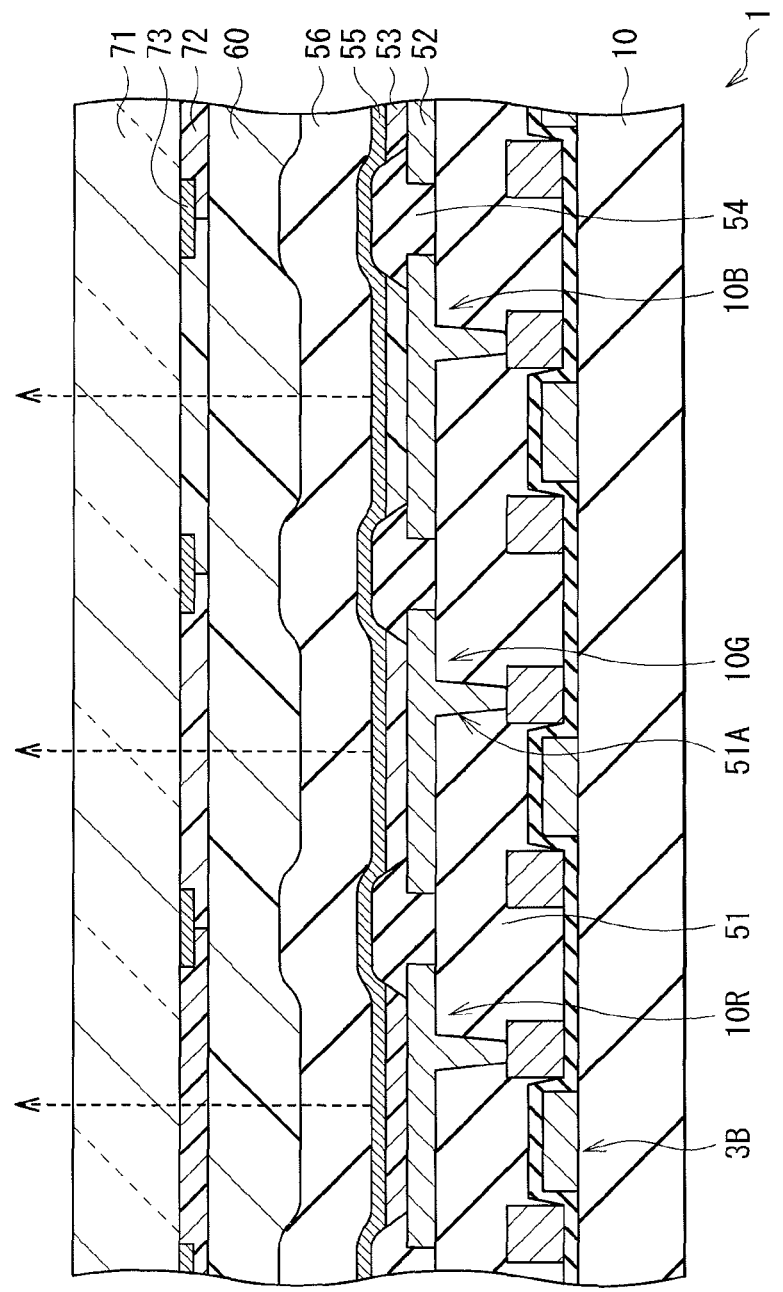
FIG. 4 is a cross-sectional diagram showing a structure of a display region illustrated in FIG. 1.

FIG. 4 shows a cross-sectional structure of the display region 110. At the display region 110, the organic light-emitting element 10R generating red-color light, the organic light-emitting element 10G generating green-color light, and the organic light-emitting element 10B generating blue-color light are formed in order in a matrix pattern as a whole. It is to be noted that each of the organic light-emitting elements 10R, 10G, and 10B has a planar shape in a strip form, and a combination of the adjoining organic light-emitting elements 10R, 10G, and 10B composes a single pixel.

Each of the organic light-emitting elements 10R, 10G, and 10B has a configuration where an anode 52, an inter-electrode insulating film 53, an organic layer 54 including a light-emitting layer to be hereinafter described, and a cathode 55 are laminated in this order, with a planarizing insulating film 51 interposed therein, on the TFT substrate 1.

Such organic light-emitting elements 10R, 10G, and 10B are sealed in such a manner that they are covered as appropriate with a protective film 56 such as silicon nitride film and silicon dioxide film, and further a sealing substrate 71 made of glass and the like is bonded over a whole area on the protective film 56 with an adhesion layer 60 made of a material such as thermosetting resin or ultraviolet hardening resin interposed between. On the sealing substrate 71, there may be provided a color filter 72 and a light shielding film 73 as a black matrix as appropriate.

The planarizing insulating film 51 is provided to planarize a top surface of the TFT substrate 1 where the pixel driving circuit 140 including the sampling transistor 3A and the driving transistor 3B that are composed of the above-described TFT 20 is formed thereon. It is preferable that the planarizing insulating film 51 be formed with a material with excellent pattern accuracy because a microscopic connection pore 51A is formed thereon. Examples of a constituent material for the planarizing insulating film 51 include an organic material such as polyimide, or an inorganic material such as silicon oxide (SiO2). The driving transistor 3B shown in FIG. 2 is electrically connected with the anode 52 via the connection pore 51A provided on the planarizing insulating film 51.

The anode 52 is formed correspondingly to each of the organic light-emitting elements 10R, 10G, and 10B. Further, the anode 52 has a function to act as a reflecting electrode for reflecting light that is generated on a light-emitting layer, and it is preferable to have the highest possible reflectance for enhancing the light-emitting efficiency. The anode 52, which has, for example, a thickness of not less than about 100 nm nor more than about 1000 nm, is composed of a simple substance or alloy of metal elements such as silver (Ag), aluminum (Al), chromium (Cr), titanium (Ti), iron (Fe), cobalt (Co), nickel (Ni), molybdenum (Mo), copper (Cu), tantalum (Ta), tungsten (W), platinum (Pt), and gold (Au), for example.

The inter-electrode insulating film 53, which ensures the insulation performance between the anode 52 and the cathode 55, while putting a light-emitting region in an intended shape precisely, is composed of, for example, an organic material such as polyimide, or an inorganic material such as silicon oxide (SiO2). The inter-electrode insulating film 53 has an opening correspondingly to a light-emitting region on the anode 52. It is to be noted that the organic layer 54 and the cathode 55 may be provided consecutively not only at the light-emitting region but also on the inter-electrode insulating film 53, although light emission takes place only at the opening on the inter-electrode insulating film 53.

The organic layer 54 has, for example, a structure laminating a hole injection layer, a hole transport layer, a light-emitting layer, and an electron transport layer (these are not shown in the figure) in this order from the anode 52 side, although any layers other than the light-emitting layer may be provided as appropriate. Further, the organic layer 54 may be different in structure depending on a light-emitting color of each of the organic light-emitting elements 10R, 10G, and 10B. The hole injection layer is a buffer layer to enhance the hole injection efficiency, as well as to prevent any leakage. The hole transport layer is provided to enhance the hole transport efficiency to the light-emitting layer. The light-emitting layer produces a recombination of electron and hole by applying an electric field, thereby generating light. The electron transport layer is provided to enhance the electron transport efficiency to the light-emitting layer. It is to be noted that a constituent material of the organic layer 54 may be a typical low molecular or polymeric organic material without limitation.

The cathode 55, which has, for example, a thickness of not less than about 5 nm nor more than about 50 nm, is composed of a simple substance or alloy of metal elements such as aluminum (Al), magnesium (Mg), calcium (Ca), and sodium (Na), for example. Among them, alloy of magnesium and silver (Mg–Ag alloy) or alloy of aluminum (Al) and lithium (Li) (Al—Li alloy) is preferable. Alternatively, the cathode 55 may be composed of ITO or IZO (indium zinc oxide (registered trademark)).

It is possible to manufacture this display unit in the following manner for example.

(Process Step of Forming TFT Substrate 1)

First, the TFT 20 having the oxide semiconductor layer 23 is formed on the substrate 10 to form the TFT substrate 1. In other words, a two-layer structure including a molybdenum (Mo) layer with a thickness of about 50 nm and an aluminum (Al) layer or an aluminum alloy layer with a thickness of about 400 nm for example is formed on the substrate 10 made of glass using a sputtering method for example. Next, the gate electrode 21 is formed as shown in FIG. 5A by performing the photolithography and etching for the two-layer structure.

Figure 5A:
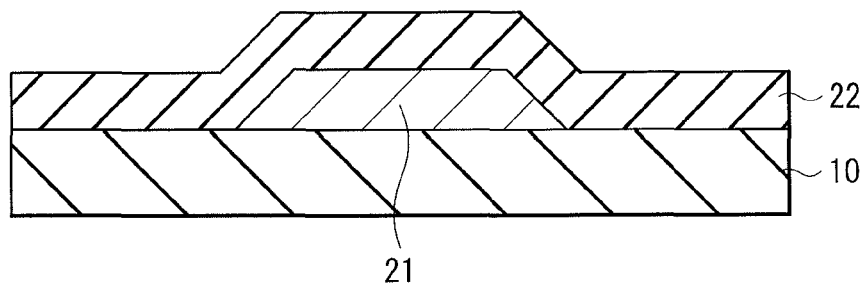
FIGS. 5A and 5B are each a cross-sectional diagram showing a method of manufacturing the display unit illustrated in FIG. 1 in the order corresponding to process steps thereof.

Subsequently, similarly as shown in FIG. 5A, the gate insulating film 22 that is composed of the materials with thicknesses as described above is formed over a whole surface of the substrate 10 using a plasma CVD (Chemical Vapor Deposition) method for example.

Figure 5B:
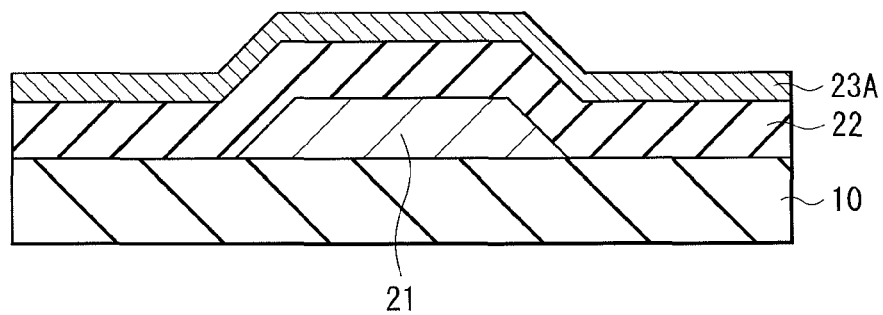

After formation of the gate insulating film 22, as shown in FIG. 5B, a target composed of IGZO for example is used to form an oxide semiconductor material film 23A over a whole surface of the gate insulating film 22 under the atmosphere of mixed gas of argon and oxygen utilizing a reactive DC sputtering method.

Figure 6:
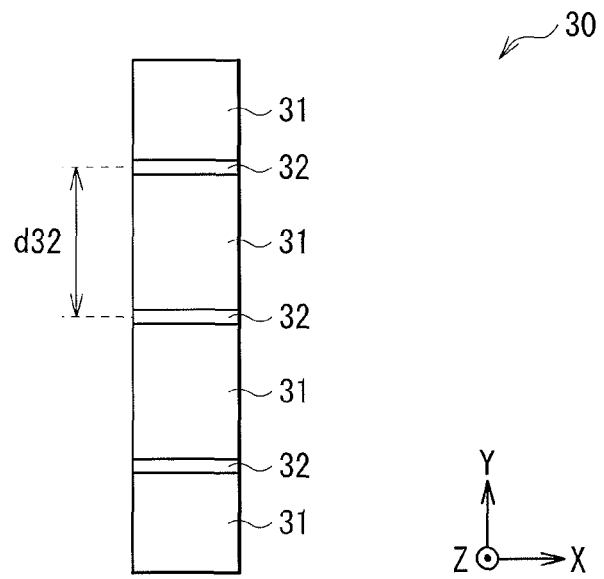
FIG. 6 is a plan view showing a configuration of a target to be used in the process step illustrated in FIG. 5B.

FIG. 6 shows a planar configuration of a target 30 to be used for the film deposition of the oxide semiconductor material film 23A. The target 30 is an inline type or a multi-target type in which a plurality of (for example, four in FIG. 6) rectangular divided portions 31 are arranged in one direction (y-direction) to join them together in a planar form. There is a joint 32 between the adjoining divided portions 31. For example, the joint 32 extends in a direction (x-direction) orthogonal to the direction (y-direction) where the divided portions 31 are arranged. The divided portions 31 are butted without any joint gap to be bonded against a base material (not shown in the figure) with an actual void width of the joint 32 of approximately zero (less than about 1 mm)

Figure 7:
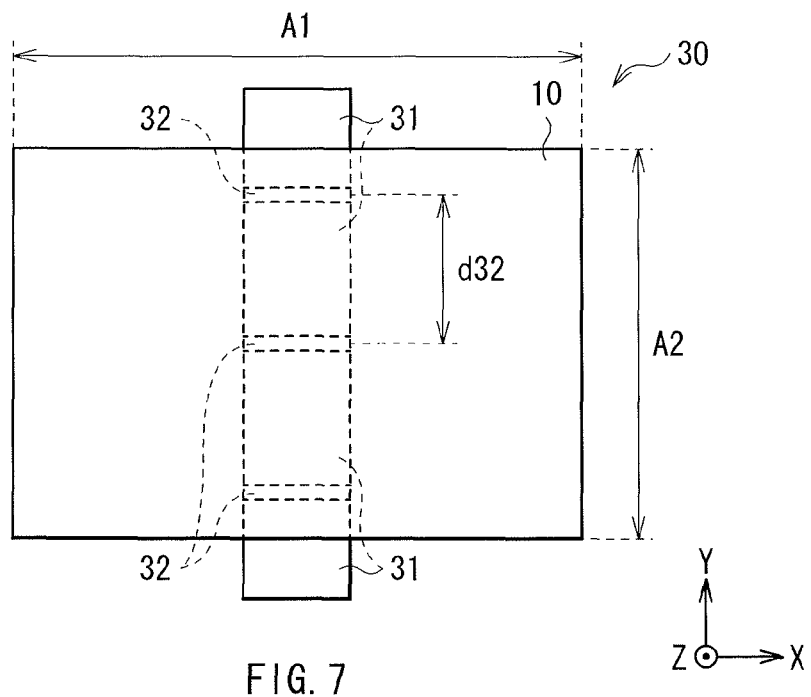
FIG. 7 is a plan view for explaining an oscillating or advancing direction of a substrate above a target illustrated in FIG. 6.

Sputtering equipment uses an inline method to carry out the film deposition with the target 30 faced with the substrate 10 as shown in an example in FIG. 7. The substrate 10 may be placed in a stationary state, or may be placed in an oscillating or fluctuating state in a direction indicated by an arrow A1 above the target 30. To avoid a growth in size of the unit and a sputtering target and suppress the manufacturing cost, it is preferable that a displacement direction A1 of the substrate 10 be a direction (x-direction) vertical to a long side direction of the target to minimize any necessary target width.

A spacing interval d32 between two joints 32 side-by-side with one another on the target 30 is made equal to or less than a width of the luminance distribution arising at the display region 110 in a direction A2 orthogonal to the joints 32. Consequently, the method of manufacturing the display unit allows the luminance unevenness to be reduced.

Further, when the film deposition is performed by oscillating or advancing the substrate 10 in opposition to the target 30, it is preferable that the spacing interval d32 between two joints 32 side-by-side with one another on the target 30 be equal to or less than a width of the luminance distribution arising at the display region 110 in a direction A2 orthogonal to the displacement direction A1 of the substrate 10. It is to be noted that, in this embodiment of the present disclosure, the joint 32 is provided in a direction (x-direction) vertical to a long side direction of the target, and thus the displacement direction A1 of the substrate 10 is same as a direction of the joint 32.

Figure 8A:
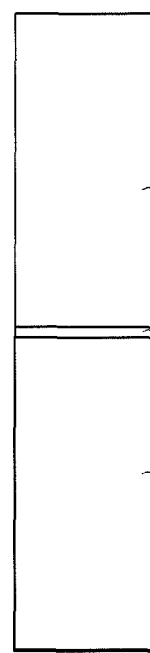
FIG. 8A is a plan view showing an example of a two-division target.
Figure 8B:
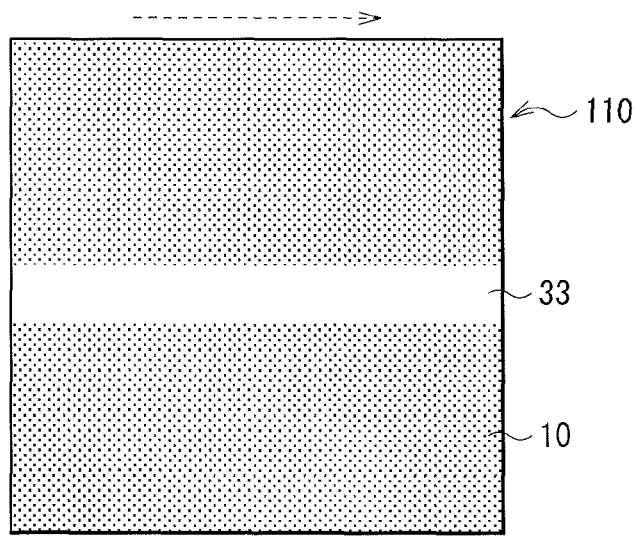
FIG. 8B is a schematic diagram showing a state of the luminance unevenness arising on a display unit that is formed using the two-division target illustrated in FIG. 8A.

Hereinafter, this is described further in details. For example, a two-division target 30A has one joint 32 between two divided portions 31 as shown in FIG. 8A. In forming the oxide semiconductor material film 23A while advancing substrate 10 in opposition to such a two-division target 30A, as shown in FIG. 8B, a local luminance distribution 33 (region different from any other region in the luminance) is generated at the finished display region 110. One reason is as follows. Because there exists the joint 32 within an erosion region on the two-division target 30A, membranous variation in the oxide semiconductor material film 23A occurs at a region where oxide semiconductor particulates scattering from the vicinity of the joint 32 are deposited on the substrate 10. Membranous variation tends to occur especially in a polyphyletic material such as IGZO. This membranous variation also changes the characteristics of the TFT 20, leading to variation in luminance of the organic light-emitting elements 10R, 10G, and 10B as well. More specifically, a threshold of the TFT 20 increases, and a drain current decreases even for the same source-drain voltage. Therefore, the organic light-emitting elements 10R, 10G, and 10B degrade the luminance in spite of normal lighting, becoming a local linear dark space. A location of the dark space, that is, the luminance distribution 33 coincides with a location of the joint 32.

For the two-division target 30A with only one joint 32, as shown in FIG. 9A, the luminance distribution 33 is generated in the direction A2 orthogonal to the joint 32 at a location in opposition to the joint 32 and at a region in the vicinity of such a location at the display region 110. A width w33 of the luminance distribution 33, which is in the order of about 40 mm for example, is greater than a width in a void of the joint 32. Here, the width w33 is a width (half-value width) of a region where the luminance decreasing amount is not less than a half (½) of a luminance difference ΔI between the lowest luminance in the luminance distribution 33 and the luminance at other regions.

On the other hand, in this embodiment of the present disclosure, the spacing interval d32 between two joints 32 side-by-side with one another on the target 30 is made equal to or less than the width w33 of the luminance distribution 33. Accordingly, at the display region 110, as shown in FIG. 9B, the luminance distribution 33 is generated at a location in opposition to each of the joints 32 and at a region in the vicinity of such a location, and such a luminance distribution 33 is superposed, resulting in a luminance distribution 34 as the whole display region 110 being planarized to reduce the luminance difference ΔI.

In concrete terms, it is preferable that the spacing interval d32 between two joints 32 side-by-side with one another on the target 30 be about 40 mm or less for example. Because the width w33 of the luminance distribution 33 is in the order of about 40 mm, the spacing interval d32 between the joints 32 is set to about 40 mm or less, thereby allowing the luminance distribution 34 as the whole display region 110 to be planarized.

Figure 10A:
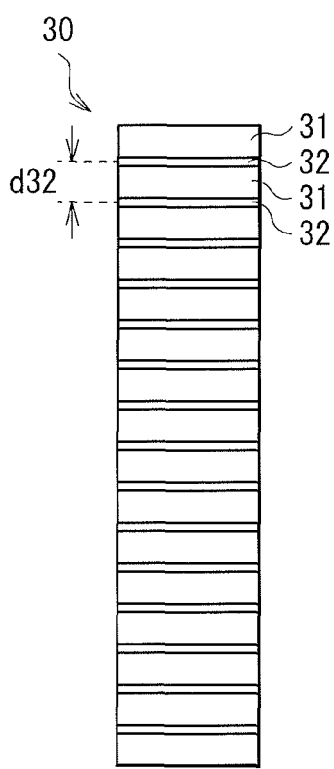
FIG. 10A is a plan view showing an example of an inline type or multi-target type target according to an embodiment of the present disclosure.
Figure 10B:
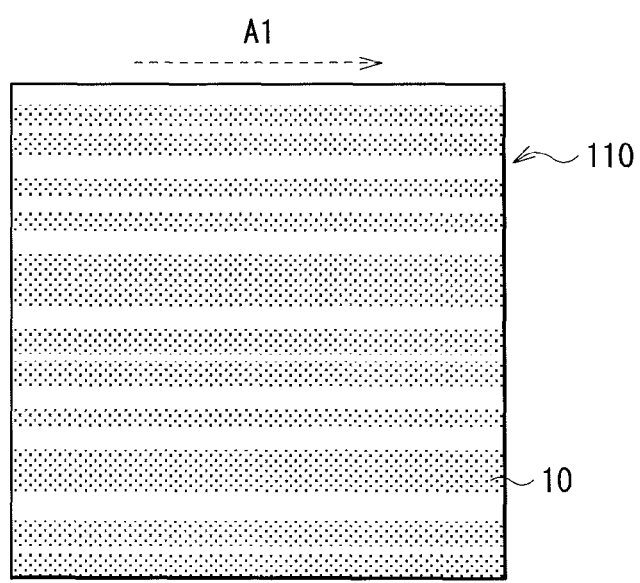
FIG. 10B is a schematic diagram showing a state of the luminance unevenness arising on a display unit that is formed using the target illustrated in FIG. 10A.

FIG. 10A shows an example of a planar configuration of an inline type or a multi-target type target 30 wherein the spacing interval d32 between two joints 32 side-by-side with one another is made equal to or less than the width w33 of this luminance distribution 33, to be specific, about 40 mm or less, while FIG. 10B schematically shows a state of the luminance distribution arising at the display region 110 when this target 30 is used. As seen from FIG. 10B, luminance of the finished display region 110 is more uniformized as compared with a case when the two-division target 30A is used (FIG. 8A).

FIG. 11A shows a planar configuration of a sheet type four-division target 30B. This four-division target 30B has a crosshair joint 32 at a boundary of four divided portions 31. When the oxide semiconductor material film 23A is formed using such a four-division target 30B, as shown in FIG. 11B, the local luminance distribution 33 (region different from any other region in the luminance) is generated in a crosshair form at the finished display region 110 as well.

FIG. 12A shows an example of a planar configuration of a sheet type target 30 wherein the spacing interval d32 between two joints 32 side-by-side with one another is made equal to or less than the width w33 of this luminance distribution 33, to be specific, about 40 mm or less, while FIG. 12B schematically shows a state of the luminance distribution arising at the display region 110 when this target 30 is used. As seen from FIG. 12B, luminance of the finished display region 110 is more uniformized as compared with a case when the four-division target 30B is used (FIG. 11B).

Figure 13A:
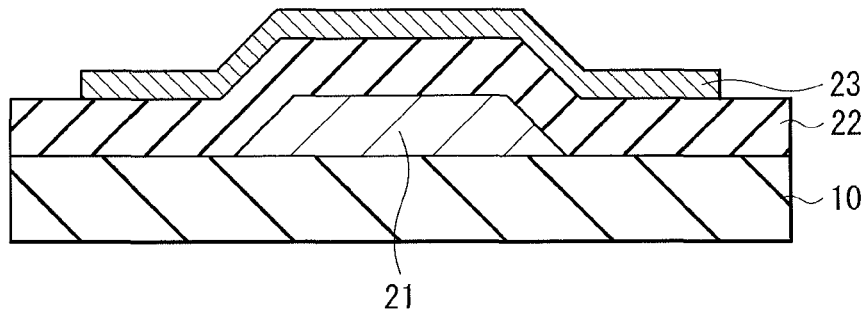
FIGS. 13A, 13B, and 13C are each a cross-sectional diagram showing process steps following FIG. 5B.

After the oxide semiconductor material film 23A is formed in such a manner, the oxide semiconductor material film 23A is shaped to have a predetermined shape using the photolithography and etching for example. This forms the oxide semiconductor layer 23 as shown in FIG. 13A.

Figure 13B:
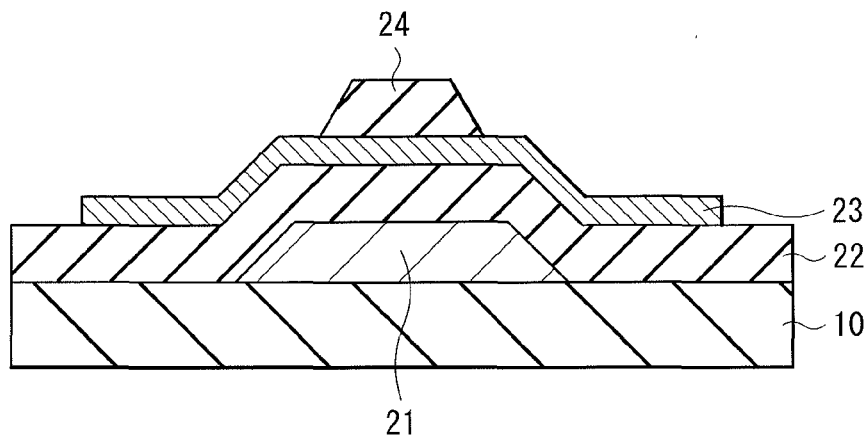

After formation of the oxide semiconductor layer 23, a channel protective layer material film (not shown in the figure) that is composed of a silicon dioxide film, silicon nitride film, silicon oxynitride film, aluminum oxide film, or the like is formed using, for example, an atomic layer deposition method, sputtering method, or CVD method, and the resulting film is shaped to have a predetermined shape using the photolithography and etching. This forms the channel protective layer 24 as shown in FIG. 13B.

Figure 13C:
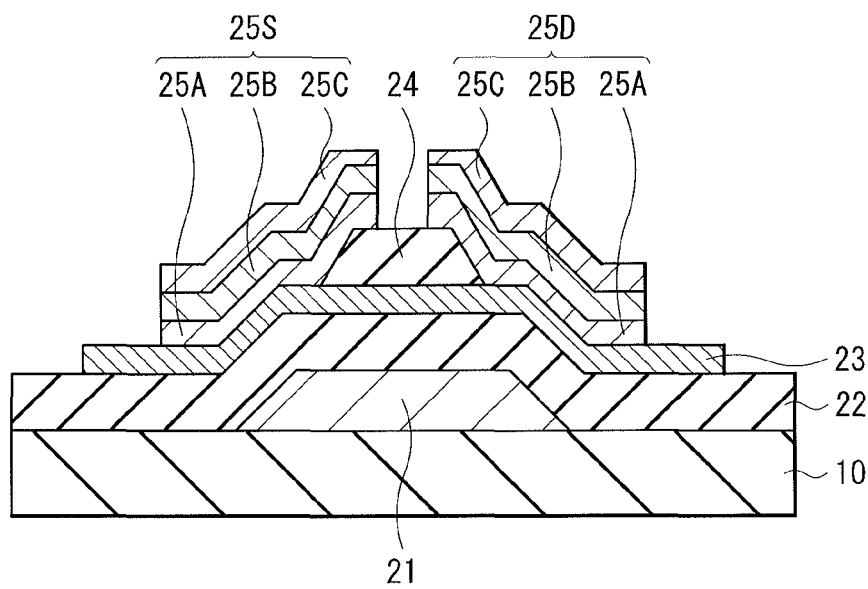

Subsequently, a titanium layer 25A with a thickness of about 50 nm, an aluminum layer 25B with a thickness of about 500 nm, and a titanium layer 25C with a thickness of about 50 nm are formed using a sputtering method for example, and these layers are shaped to have a predetermined shape using the photolithography and etching. This forms the source electrode 25S and the drain electrode 25D as shown in FIG. 13C.

After the formation of the source electrode 25S and the drain electrode 25D, as shown in FIG. 3, the passivation film 26 composed of the material with the thickness as described is formed using, for example, an atomic layer deposition method, sputtering method, or CVD method. Such process steps described above form the TFT substrate 1 with the TFT 20 as shown in FIG. 3.

(Process Step of Forming Organic Light-Emitting Elements 10R, 10G, and 10B)

Next, the display region 110 composed of the organic light-emitting elements 10R, 10G, and 10B is formed above the TFT 20. In other words, in the first place, the planarizing insulating film 51 and the connection pore 51A are formed and sintered through coating of photosensitive resin over a whole surface of the TFT substrate 1 followed by exposure and development. Subsequently, the anode 52 composed of the above-described material is formed using, for example, a direct-current sputtering, and then this is etched selectively using, for example, a lithographic technique to be patterned in a predetermined shape. Thereafter, the inter-electrode insulating film 53 composed of the material with the thickness as described is formed using, for example, a CVD method, and then an opening is formed using, for example, a lithographic technique. Afterward, the organic layer 54 and the cathode 55 that are composed of the above-described materials are formed sequentially using, for example, a vapor deposition method to form the organic light-emitting elements 10R, 10G, and 10B. Then, the organic light-emitting elements 10R, 10G, and 10B are covered with the protective film 56 composed of the above-described material.

Subsequently, the adhesion layer 60 is formed on the protective film 56. Thereafter, the color filter 72 and the light shielding film 73 are provided, and then the sealing substrate 71 composed of the above-described material is prepared to stick the TFT substrate 1 and the sealing substrate 71 together with the adhesion layer 60 interposed between. This completes the display unit as shown in FIG. 4.

On this display unit, the sampling transistor 3A is put in a conducting state according to a control signal provided from the scan line WSL, and a signal potential of an image signal provided from the signal line DTL is sampled to be held on the holding capacitor 3C. Further, a current is provided to the driving transistor 3B from the power supply line DSL that is at a first potential, and a driving current is provided to the light-emitting element 3D (organic light-emitting elements 10R, 10G, and 10B) in accordance with a signal potential held on the holding capacitor 3C. The light-emitting element 3D (organic light-emitting elements 10R, 10G, and 10B) emits light with the luminance in accordance with a signal potential of an image signal on the basis of the provided driving current. This light is transmitted through the cathode 55, the color filter 72, and the sealing substrate 71 to be taken out.

In the present embodiment, in the process step of forming the oxide semiconductor layer 23 using a sputtering method, the spacing interval d32 between two joints 32 side-by-side with one another on the target 30 is made equal to or less than the width w33 of the luminance distribution 33 arising at the display region 110 in the direction A2 orthogonal to the joints 32. Accordingly, at the display region 110, as shown in FIG. 9B, the luminance distribution 33 is generated at a location in opposition to each of the joints 32 and at a region in the vicinity of such a location, and such a luminance distribution 33 is superposed, resulting in the luminance distribution 34 as the whole display region 110 being planarized to achieve the uniform light emission.

As described, in this embodiment of the present disclosure, the spacing interval d32 between two joints 32 side-by-side with one another on the target 30 is made equal to or less than the width w33 of the luminance distribution 33 arising at the display region 110 in the direction A2 orthogonal to the displacement direction A1 of the substrate 10, which allows to reduce the luminance unevenness and enhance the display quality. Further, it is possible to reduce the divided portions 31 in size in the manufacturing of an oxide semiconductor target having difficulty in growing in size. This makes it possible to easily manufacture the good-quality oxide semiconductor target to achieve the improved yield and cost reduction.

SECOND EMBODIMENT

Figure 14:
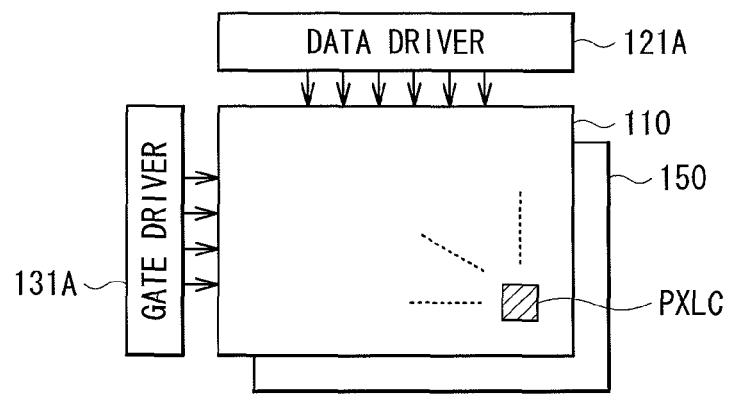
FIG. 14 is a diagram showing a configuration of a display unit according to a second embodiment of the present disclosure.

FIG. 14 shows an overall configuration of a display unit according to a second embodiment of the present disclosure. This display unit, which is used as a liquid crystal television receiver and the like, is provided with, for example, a display region 110 where pixels PXLC composed of a plurality of liquid crystal display elements 10L to be hereinafter described as display elements are disposed in a matrix pattern on the above-described TFT substrate 1. At the periphery of the display region 110, there are disposed a data driver 121A that is a signal section and a gate driver 131A that is a scanner section. At the rear side of the display region 110, there is provided an illuminating section 150 as a backlight unit.

Figure 15:
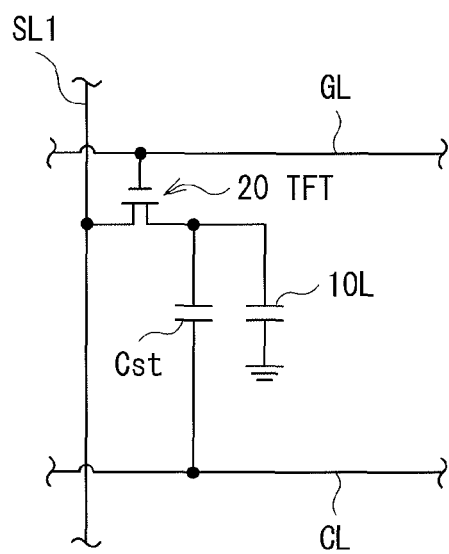
FIG. 15 is an equivalent circuit diagram of a pixel illustrated in FIG. 14.

FIG. 15 shows an equivalent circuit of the pixel PXLC. The pixel PXLC has the TFT 20 that is described in the first embodiment, the liquid crystal display element 10L, and a capacitor element Cst.

The TFT 20, which has a function as a switching element to provide an image signal to the pixels PXLC, is configured in the same manner as with the first embodiment. A gate of the TFT 20 is connected with a gate bus line GL extending in a horizontal direction. A source bus line SL extending in a vertical direction is orthogonal to the gate bus line GL. A source of the TFT 20 is connected with the source bus line SL, while a drain is connected with a first end of the liquid crystal display element 10L and a first end of the capacitor element Cst.

The liquid crystal element 10L has a function as a display element to perform an operation for display in accordance with a signal voltage provided via the TFT 20. A second end of the liquid crystal element 10L is grounded.

The capacitor element Cst generates a potential difference across both ends. In concrete terms, the capacitor element Cst includes a dielectric to store electrical charge. A second end of the capacitor element Cst is connected with a capacitor element bus line CL which is side-by-side with respect to the gate bus line GL, that is, extends in a horizontal direction.

Figure 16:
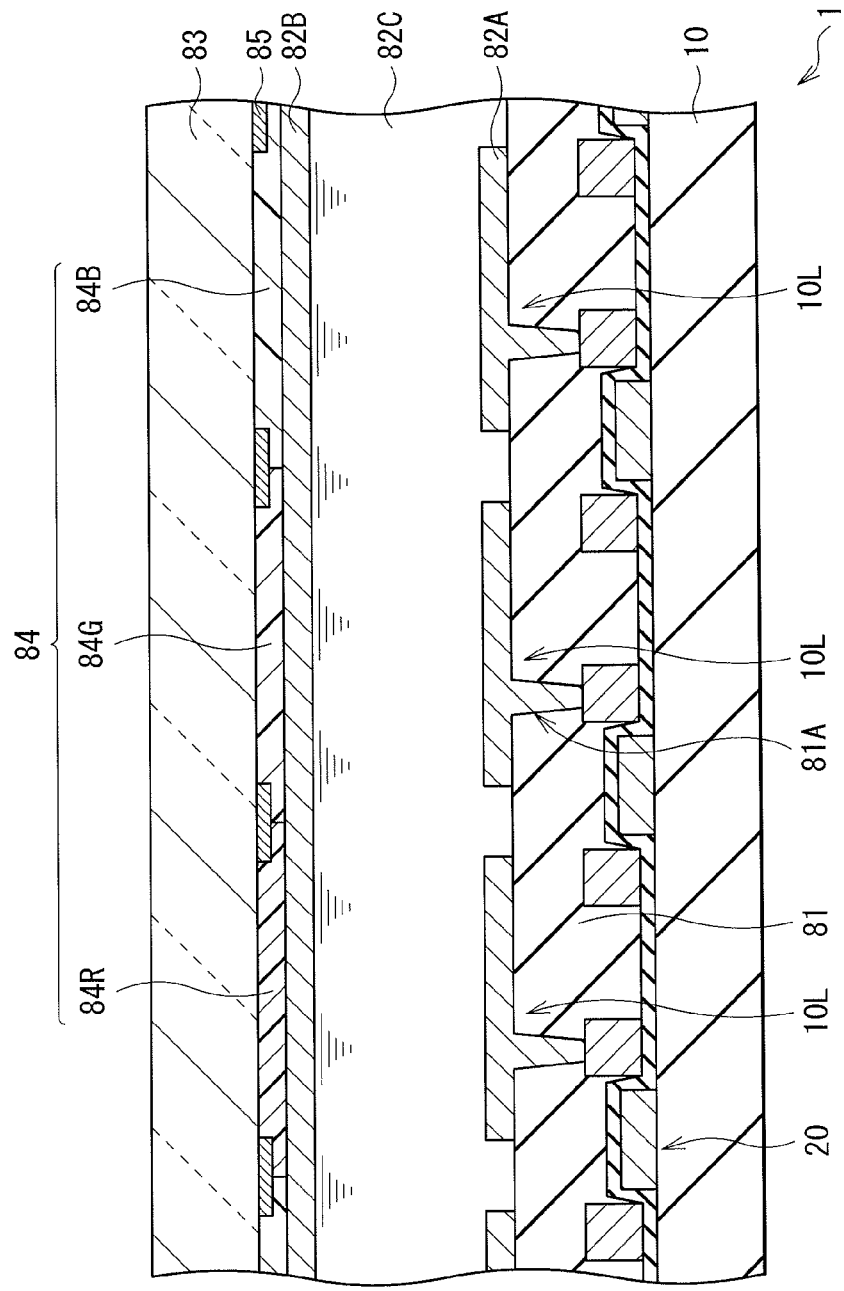
FIG. 16 is a cross-sectional diagram showing a structure of a display region illustrated in FIG. 14.

FIG. 16 shows a cross-sectional structure of the display region 110. As with the first embodiment, the TFT substrate 1 has the TFT 20 having an oxide semiconductor layer 23 (see FIG. 3) on a substrate 10. The liquid crystal element 10L has a pixel electrode 82A composed of ITO for example on a planarizing insulating film 81. Further, on a facing substrate 83, there are provided a color filter 84 composed of a red-color filter 84R, a green-color filter 84G, and a blue-color filter 84B, a light shielding film 85, and a common electrode 82B composed of ITO for example. A liquid crystal layer 82C is provided between the pixel electrode 82A and the common electrode 82B. It is to be noted that the capacitor element Cst is omitted in FIG. 16.

The planarizing insulating film 81 is configured in the same manner as the planarizing insulating film 51 according to the first embodiment. The TFT 20 is connected with the pixel electrode 82A via a connection pore 81A provided on the planarizing insulating film 81.

It is possible to manufacture this display unit in the following manner for example.
(Process Step of Forming TFT Substrate 1)

First, as with the first embodiment, the TFT 20 having the oxide semiconductor layer 23 is formed on the substrate 10 to form the TFT substrate 1.

In other words, as with the first embodiment, the gate electrode 21 and the gate insulating film 22 are formed in a process step illustrated in FIG. 5A.

Subsequently, as with the first embodiment, the oxide semiconductor material film 23A is formed in a process step illustrated in FIG. 5B. At this time, as with the first embodiment, as shown in FIG. 6, the target 30 of an inline type or a multi-target type in which a plurality of (for example, four in FIG. 6) rectangular divided portions 31 are arranged in one direction (y-direction) to join them together in a planar form is used, and the film deposition is performed with the target 30 faced with the substrate 10 as shown in FIG. 7. The substrate 10 may be placed in a stationary state, or may be placed in an oscillating or fluctuating state in a direction indicated by an arrow A1 above the target 30.

As with the first embodiment, a spacing interval d32 between two joints 32 side-by-side with one another on the target 30 is made equal to or less than a width of the luminance distribution arising at the display region 110 in a direction A2 orthogonal to the joints 32. Consequently, the method of manufacturing the display unit allows the luminance unevenness to be reduced as with the first embodiment.

Further, when the film deposition is performed by oscillating or advancing the substrate 10 in opposition to the target 30, as with the first embodiment, it is preferable that the spacing interval d32 between two joints 32 side-by-side with one another on the target 30 be equal to or less than a width of the luminance distribution arising at the display region 110 in a direction A2 orthogonal to a displacement direction A1 of the substrate 10. For details, the description with reference to FIGS. 8A and 8B as well as FIGS. 9A and 9B in the first embodiment is true of this embodiment.

In concrete terms, as with the first embodiment, it is preferable that the spacing interval d32 between two joints 32 side-by-side with one another on the target 30 be about 40 mm or less for example. Because the width w33 of the luminance distribution 33 is in the order of about 40 mm, the spacing interval d32 between the joints 32 is set to about 40 mm or less, thereby allowing the luminance distribution 34 as the whole display region 110 to be planarized.

After the oxide semiconductor material film 23A is formed in such a manner, the oxide semiconductor material film 23A is shaped to have a predetermined shape to form the oxide semiconductor layer 23 in a process step illustrated in FIG. 13A as with the first embodiment.

Subsequently, the channel protective layer 24 is formed in a process step illustrated in FIG. 13B as with the first embodiment. Thereafter, the source electrode 25S and the drain electrode 25D are formed in a process step illustrated in FIG. 13C as with the first embodiment.

After the formation of the source electrode 25S and the drain electrode 25D, as with the first embodiment, the passivation film 26 is formed. Such process steps described above form the TFT substrate 1 with the TFT 20 as shown in FIG. 3.
(Process Step of Forming Liquid Crystal Display Element 10L)

Next, the display region 110 composed of the liquid crystal display elements 10L is formed above the TFT 20. In other words, in the first place, the planarizing insulating film 81 and the connection pore 81A are formed and sintered through coating of photosensitive resin over a whole surface of the TFT substrate 1 followed by exposure and development. Subsequently, the pixel electrode 82A composed of the above-described material is formed using, for example, a direct-current sputtering, and then this is etched selectively using, for example, a lithographic technique to be patterned in a predetermined shape.

Further, the color filter 84, the light shielding film 85, and the common electrode 82B composed of the above-described material are formed on the facing substrate 83, and the TFT substrate 1 and the facing substrate 83 are bonded together with a sealing frame (not shown in the figure) interposed between. Thereafter, the liquid crystal layer 82C is formed between the pixel electrode 82A and the common electrode 82B by injecting liquid crystal from an opening (not shown in the figure) of the sealing frame, and then the opening is sealed. This completes the display unit illustrated in FIG. 14.

On this display unit, light from the illuminating section 150 is diffused uniformly by an optical sheet (not shown in the figure) to come into the liquid crystal display element 10L. This incoming light is transmitted through the liquid crystal layer 82C while being modulated for each pixel on the basis of an image voltage applied between the pixel electrode 82A and the common electrode 82B. The light that is transmitted through the liquid crystal layer 82C passes through the color filter 84, thereby being taken out to the outside of the facing substrate 83 as color display light.

In the present embodiment, as with the first embodiment, in the process step of forming the oxide semiconductor layer 23 using a sputtering method, the spacing interval d32 between two joints 32 side-by-side with one another on the target 30 is made equal to or less than the width w33 of the luminance distribution 33 arising at the display region 110 in the direction A2 orthogonal to the joints 32. Accordingly, as with the first embodiment, at the display region 110, as shown in FIG. 9B, the luminance distribution 33 is generated at a location in opposition to each of the joints 32 and at a region in the vicinity of such a location, and such a luminance distribution 33 is superposed, resulting in the luminance distribution 34 as the whole display region 110 being planarized to achieve the uniform light emission. Such a beneficial effect becomes prominent and is effective especially when a shortage of writing to a capacitor formed between the pixel electrode 82A and the common electrode 82B occurs increasing definition and frame rate, or with increasing signal delay due to a growth in screen size.

As described, in this embodiment of the present disclosure, the spacing interval d32 between two joints 32 side-by-side with one another on the target 30 is made equal to or less than the width w33 of the luminance distribution 33 arising at the display region 110 in the direction A2 orthogonal to the displacement direction A1 of the substrate 10, which allows to reduce the luminance unevenness and enhance the display quality as with the first embodiment. Further, it is possible to reduce the divided portions 31 in size in the manufacturing of an oxide semiconductor target having difficulty in growing in size. This makes it possible to easily manufacture the good-quality oxide semiconductor target to achieve the improved yield and cost reduction.

THIRD EMBODIMENT

Figure 17:
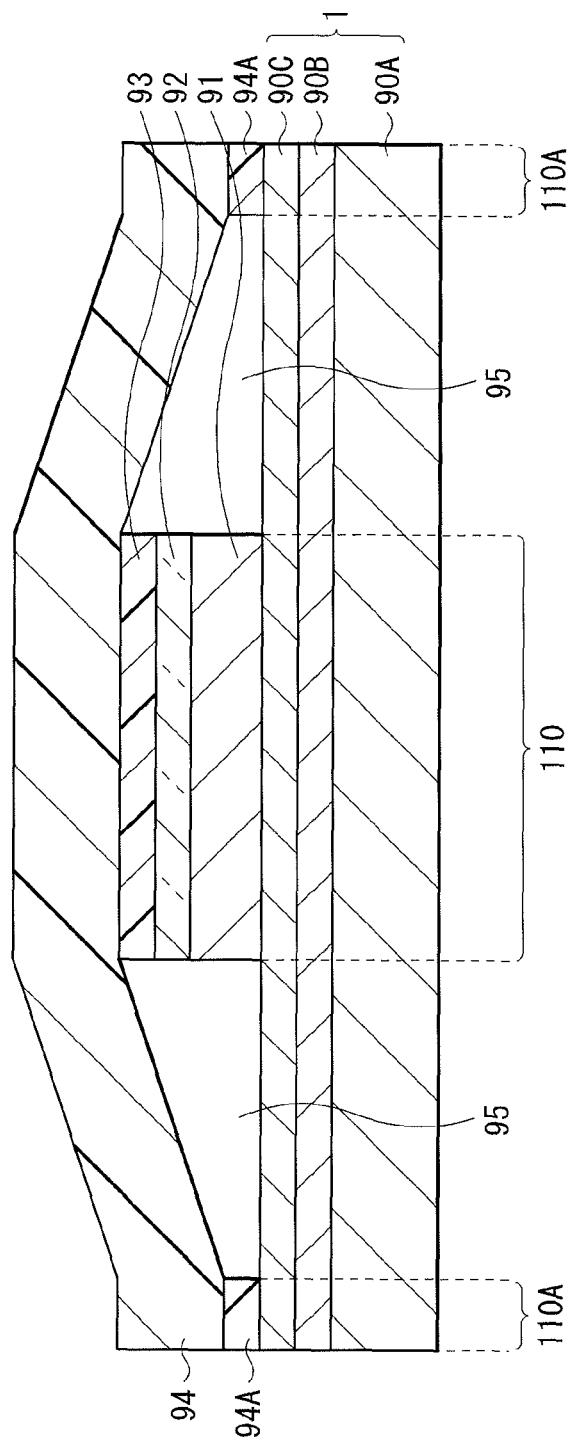
FIG. 17 is a cross-sectional diagram showing a structure of a display unit according to a third embodiment of the present disclosure.

FIG. 17 shows a cross-sectional structure of a display unit according to a third embodiment of the present disclosure. This display unit, which is an electrophoretic display (so-called electronic paper display) to display images (for example, character information and the like) utilizing an electrophoretic phenomenon, has a display layer 91, a facing substrate 92, a transparent adhesion layer 93, and a protective layer 94 in this order on a TFT substrate 1. It is to be noted that FIG. 17 shows a shape of this display unit schematically, and the illustrated structure is different from the actual dimensions and shape.

Figure 18:
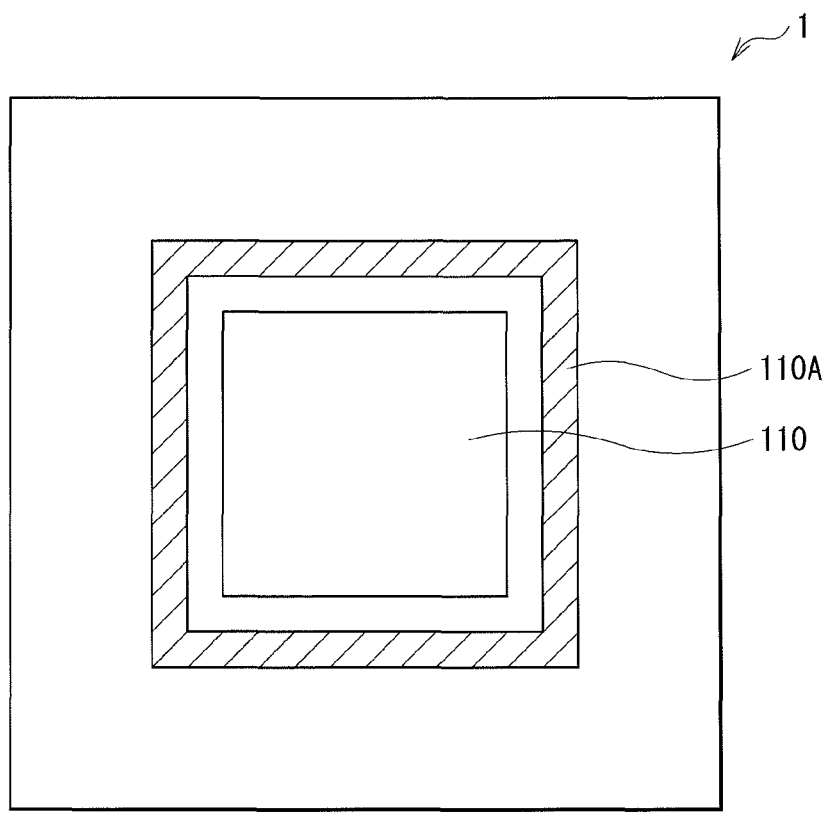
FIG. 18 is a plan view showing a configuration of a driving substrate illustrated in FIG. 17.

As shown in FIG. 18, the TFT substrate 1 is provided with an adhesive region 110A to surround (or completely surround) a display region 110 around the display region 110 at the center. The display layer 91 is provided on the display region 110, and an end of the protective layer 94 is bonded by an adhesion layer 94A at the adhesive region 110A.

The TFT substrate 1 laminates a barrier layer 90B and a TFT (Thin-Film Transistor) circuit 90C in this order on a substrate 90A. The substrate 90A is composed of: an inorganic material such as glass, quartz, silicon, and gallium arsenide; a metal material such as stainless steel; or a plastic material such as polyimide, polyethylene terephthalate (PET), polyethylene naphthalate (PEN), polymethyl methacrylate (PMMA), polycarbonate (PC), polyether sulfone (PES), polyethyl ether ketone (PEEK), and aromatic polyester (liquid crystal polymer), for example. The substrate 90A may be composed of a material having the rigidity such as wafer, or a material having the flexibility such as thin-layer glass, film, or metal foil. If the substrate 90A has the flexibility, it is possible to achieve a foldable display unit. A thickness of the substrate 90A (thickness in laminating direction; hereinafter referred to as thickness simply) is in the range of about 10 μm to 100 μm for example.

The barrier layer 90B, which is an AlOx N1-X (where X is about 0.01 to 0.2) film or a silicon nitride (Si3 N4) film that is formed using, for example, a CVD method, reduces deterioration in the TFT circuit 90C and the display layer 91 that is caused by moisture or organic gas. In most cases, the barrier layer 90B is deposited in the CVD method, and exhibits the elaboration and lower moisture permeability as compared with a case of the film deposition by the use of a vapor deposition method.

The TFT circuit 90C has a switching function to select a pixel. The TFT circuit 90C is composed of, for example, the TFT 20 that is described with reference to FIG. 3 in the first embodiment.

The display layer 91 has an electrophoretic display element between a pixel electrode and a common electrode. The pixel electrode and the common electrode come in contact with the TFT circuit 90C and the facing substrate 92, respectively. A thickness in laminating direction of the display layer 91 is in the order of about 40 μm to 165 μm for example. The pixel electrode, which is provided for each pixel, is composed of a single substance or alloy of metal elements such as chromium (Cr), gold (Au), platinum (Pt), nickel (Ni), copper (Cu), tungsten (W), aluminum (Al), and silver (Ag), for example. The common electrode, which is provided over one surface of the facing substrate 92, is composed of a light transmission conductive material (transparent electrode material) such as indium oxide-tin oxide (ITO), antimony oxide-tin oxide (ATO), fluoride-doped tin oxide (FTO), and aluminum-doped zinc oxide (AZO), for example.

The facing substrate 92, which is provided on the display region 110 as in the display layer 91, has a thickness of about 125 μm for example. In the present embodiment, an image is displayed at the facing substrate 92 side, and thus a light-transmitting material is used for the facing substrate 92, but otherwise, it is possible to use the same material as that for the substrate 90A.

The protective layer 94 is provided to seal the display layer 91. The protective layer 94 combines optical functions such as an antireflection function or antidazzle function, as well as a protective function against an external force, with a moisture-proof function, and has a film thickness of about several hundreds μm for example.

The protective layer 94 is fixed to the facing substrate 92 by the transparent adhesion layer 93. The transparent adhesion layer 93 is composed of, for example, a material such as OCA (Optical Clear Adhesive) with a thickness of about 25 μm. When the substrate 90A is composed of a flexible substrate, it is preferable that the transparent adhesion layer 93 be also flexible.

There is a void 95 between the display region 110 sealed by the protective layer 94 and the adhesive region 110A (between side faces of the display layer 91 and the protective layer 94, and between side faces of the facing substrate 92 and the protective layer 94), and the side faces of the display layer 91 and the facing substrate 92 are surrounded by the void 95.

It is possible to manufacture this display unit in the following manner for example.

(Process Step of Forming TFT Substrate 1)

Figure 19A:
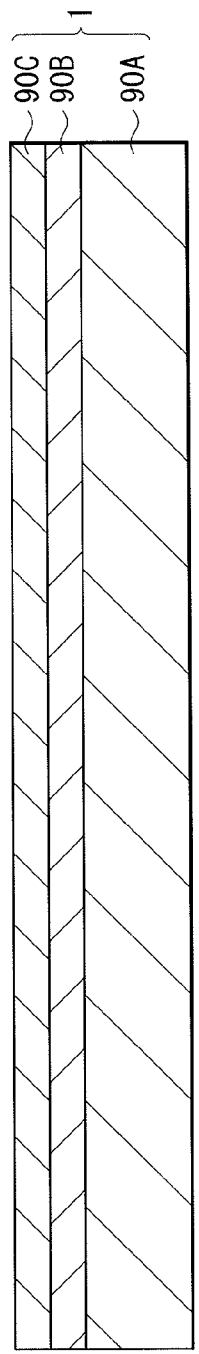
FIGS. 19A and 19B are each a cross-sectional diagram showing a method of manufacturing the display unit illustrated in FIG. 17 in the order corresponding to process steps thereof.
Figure 19B:
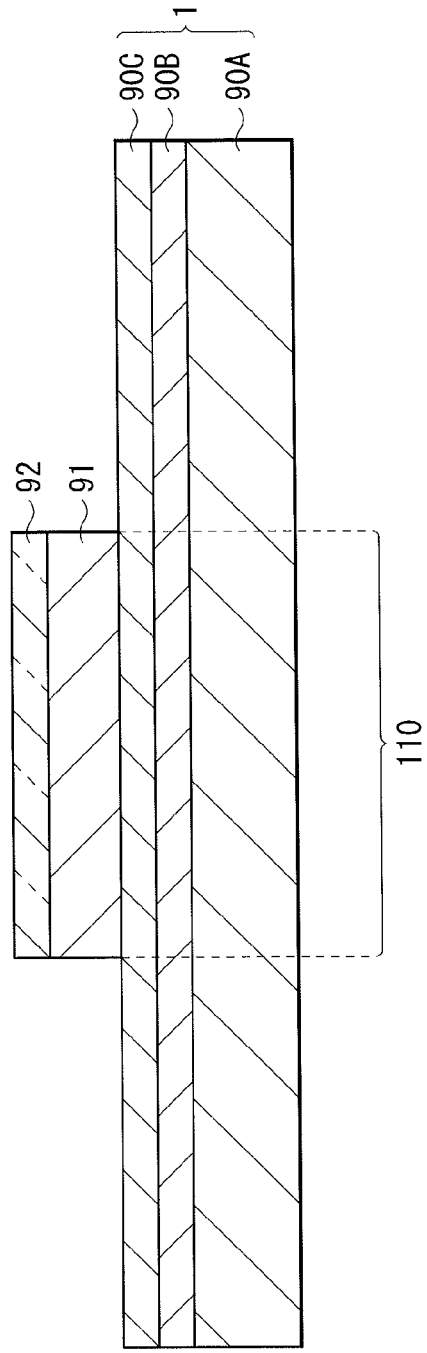

FIGS. 19A and 19B show a method of manufacturing the display unit in the order corresponding to process steps thereof. First, as shown in FIG. 19A, the barrier layer 90B composed of silicon nitride is formed on the substrate 90A using a CVD method for example. Next, as shown in FIG. 19A, the TFT circuit 90C composed of the TFT 20 having the oxide semiconductor layer 23 is formed on the barrier layer 90B to form the TFT substrate 1.

In other words, as with the first embodiment, the gate electrode 21 and the gate insulating film 22 are formed in a process step illustrated in FIG. 5A.

Subsequently, as with the first embodiment, the oxide semiconductor material film 23A is formed in a process step illustrated in FIG. 5B. At this time, as with the first embodiment, as shown in FIG. 6, the target 30 of an inline type or a multi-target type in which a plurality of (for example, four in FIG. 6) rectangular divided portions 31 are arranged in one direction (y-direction) to join them together in a planar form is used, and the film deposition is performed with the target 30 faced with the substrate 10 as shown in FIG. 7. The substrate 10 may be placed in a stationary state, or may be placed in an oscillating or fluctuating state in a direction indicated by an arrow A1 above the target 30.

As with the first embodiment, a spacing interval d32 between two joints 32 side-by-side with one another on the target 30 is made equal to or less than a width of the luminance distribution arising at the display region 110 in a direction A2 orthogonal to the joints 32. Consequently, the method of manufacturing the display unit allows the luminance unevenness to be reduced as with the first embodiment.

Further, when the film deposition is performed by oscillating or advancing the substrate 10 in opposition to the target 30, as with the first embodiment, it is preferable that the spacing interval d32 between two joints 32 side-by-side with one another on the target 30 be equal to or less than a width of the luminance distribution arising at the display region 110 in a direction A2 orthogonal to a displacement direction A1 of the substrate 10. For details, the description with reference to FIGS. 8A and 8B as well as FIGS. 9A and 9B in the first embodiment is true of this embodiment.

In concrete terms, as with the first embodiment, it is preferable that the spacing interval d32 between two joints 32 side-by-side with one another on the target 30 be about 40 mm or less for example. Because the width w33 of the luminance distribution 33 is in the order of about 40 mm, the spacing interval d32 between the joints 32 is set to about 40 mm or less, thereby allowing the luminance distribution 34 as the whole display region 110 to be planarized.

After the oxide semiconductor material film 23A is formed in such a manner, the oxide semiconductor material film 23A is shaped to have a predetermined shape to form the oxide semiconductor layer 23 in a process step illustrated in FIG. 13A as with the first embodiment.

Subsequently, the channel protective layer 24 is formed in a process step illustrated in FIG. 13B as with the first embodiment. Thereafter, the source electrode 25S and the drain electrode 25D are formed in a process step illustrated in FIG. 13C as with the first embodiment.

After the formation of the source electrode 25S and the drain electrode 25D, as with the first embodiment, the passivation film 26 is formed. Such process steps described above form the TFT substrate 1 with the TFT 20 as shown in FIG. 3. (Process Step of Forming Electrophoretic Display Layer 91)

After the formation of the TFT substrate 1, a metal film composed of metal elements such as chromium, gold, platinum, nickel, copper, tungsten, aluminum, and silver for example is formed over a whole surface of the TFT substrate 1, and is patterned, thereby forming the pixel electrode.

Subsequently, as shown in FIG. 19B, a display element is formed on the facing substrate 92 including the common electrode by coating for example, and then the facing substrate 92 is bonded to the TFT substrate 1. This forms the display layer 91 and the facing substrate 92 on the TFT substrate 1. The common electrode may be formed in advance by forming, for example, the ITO over a whole surface at one side of the facing substrate 92.

After the facing substrate 92 is bonded, the protective film 94 is fixed on the facing substrate 92 by the transparent adhesion layer 93. At this time, the protective film 94 with all sides thereof greater than sides of the display region 110 and with the area thereof greater than that of the display region 110 is used. This forms a portion protruding to the outside of the display region 110 on the protective film 94. Subsequently, the portion protruding from the display region 110 on the protective film 94 is folded back toward the TFT substrate 1, and is so fixed to the adhesive region 110A of the TFT substrate 1, using the adhesion layer 94, as to cover the side surface of the display layer 91. This completes the display unit as shown in FIG. 17 and FIG. 18.

On this display unit, a display is performed by an electrophoretic display element on the display layer 91 on the basis of an image voltage applied across the pixel electrode and the common electrode.

In the present embodiment, as with the first embodiment, in the process step of forming the oxide semiconductor layer 23 using a sputtering method, the spacing interval d32 between two joints 32 side-by-side with one another on the target 30 is made equal to or less than the width w33 of the luminance distribution 33 arising at the display region 110 in the direction A2 orthogonal to the joints 32. Accordingly, as with the first embodiment, at the display region 110, as shown in FIG. 9B, the luminance distribution 33 is generated at a location in opposition to each of the joints 32 and at a region in the vicinity of such a location, and such a luminance distribution 33 is superposed, resulting in the luminance distribution 34 as the whole display region 110 being planarized to achieve the uniform light emission. Such a beneficial effect becomes prominent and is effective especially when a shortage of writing to a capacitor formed between the pixel electrode 82A and the common electrode 82B occurs with increasing definition and frame rate, or with increasing signal delay due to a growth in screen size.

As described, in this embodiment of the present disclosure, the spacing interval d32 between two joints 32 side-by-side with one another on the target 30 is made equal to or less than the width w33 of the luminance distribution 33 arising at the display region 110 in the direction A2 orthogonal to the displacement direction A1 of the substrate 10, which allows to reduce the luminance unevenness and enhance the display quality as with the first embodiment. Further, it is possible to reduce the divided portions 31 in size in the manufacturing of an oxide semiconductor target having difficulty in growing in size. This makes it possible to easily manufacture the good-quality oxide semiconductor target to achieve the improved yield and cost reduction.

APPLICATION EXAMPLES

Hereinafter, the description is provided on application examples of the display unit according to any of the above-described embodiments with reference to FIG. 20 to FIG. 27G. The display unit according to any of the above-described embodiments is applicable to display units on electronic units in various fields, such as, but not limited to, television receivers, digital cameras, notebook personal computers, mobile terminals including cellular phones and smart phones, and video cameras. In other words, this display unit is applicable to display units on electronic units in various fields that display externally input image signals or internally generated image signals as images or pictures.

(Module)

Figure 20:
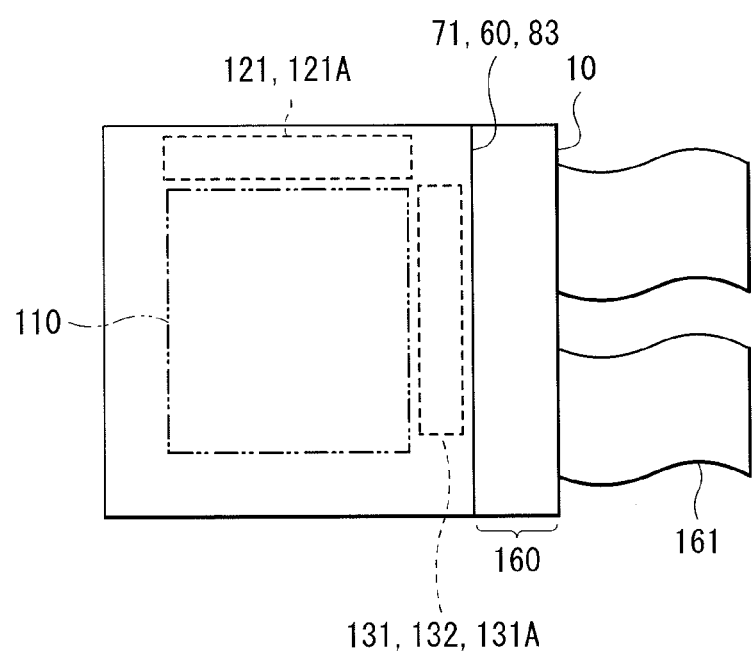
FIG. 20 is a plan view showing a schematic structure of a module including the display unit according to the above-described embodiment of the present disclosure.

The display unit according to any of the above-described embodiments is built into various electronic units such as those in application examples 1 to 7 to be hereinafter described, as a module shown in FIG. 20 for example. For example, this module has a region 160 exposed from the sealing substrate 71 and the adhesion layer 60 according to the first embodiment, or the facing substrate 83 according to the second embodiment at one side of the substrate 10, and wirings of the horizontal selector 121, the write scanner 131, and the power supply scanner 132 according to the first embodiment, or the data driver 121A and the gate driver 131A according to the second embodiment are extended to form external connection terminals (not shown in the figure) at this exposed region 160. An FPC (Flexible Printed Circuit) 161 for signal input/output may be provided for the external connection terminals.

Application Example 1

Figure 21A:
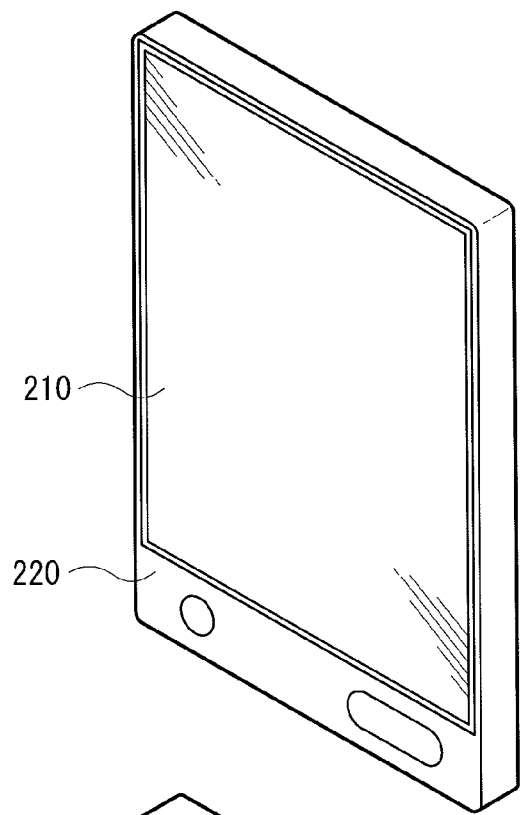
FIGS. 21A and 21B are each a perspective view showing an external appearance of an application example 1 of the display unit according to the above-described embodiment of the present disclosure.
Figure 21B:
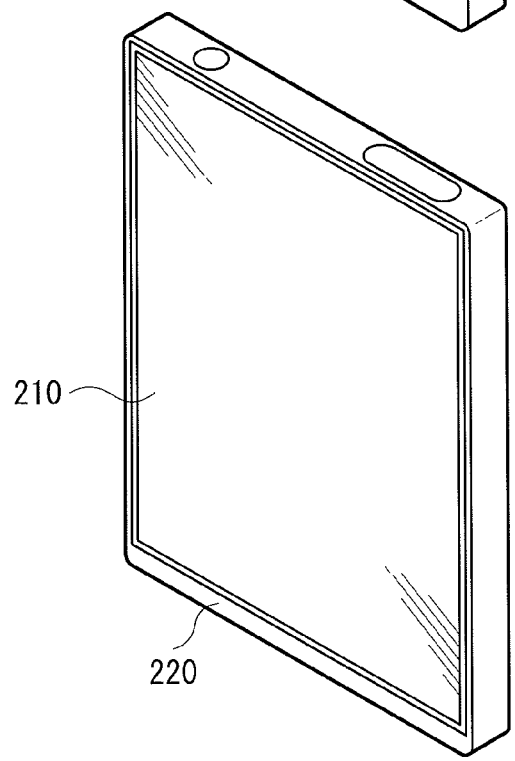

Each of FIG. 21A and FIG. 21B shows an external view of an electronic book to which the display unit according to any of the above-described embodiments is applicable. This electronic book has, for example, a display section 210 and a nondisplay section 220, and the display section 210 is composed of the display unit according to any of the above-described embodiments.

Application Example 2

Figure 22:
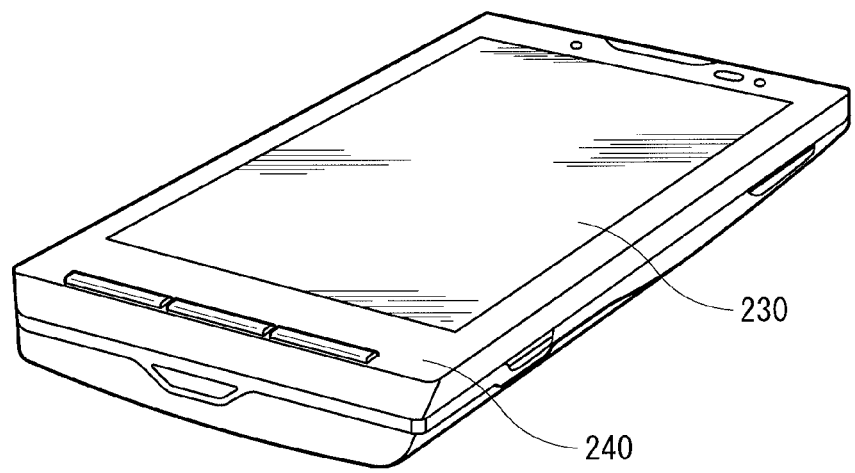
FIG. 22 is a perspective view showing an external appearance of an application example 2.

FIG. 22 shows an external view of a smart phone to which the display unit according to any of the above-described embodiments is applicable. This smart phone has, for example, a display section 230 and a nondisplay section 240, and the display section 230 is composed of the display unit according to any of the above-described embodiments.

Application Example 3

Figure 23:
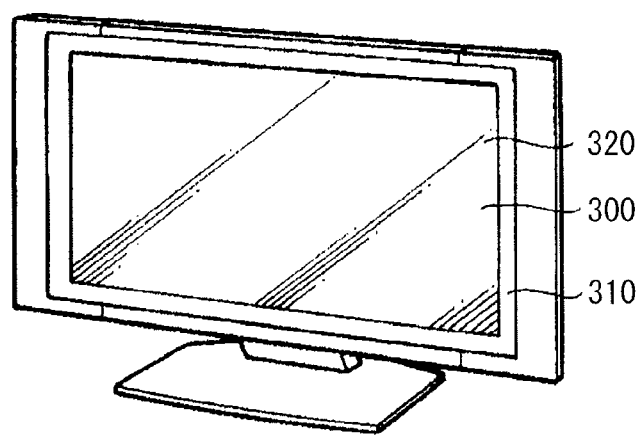
FIG. 23 is a perspective view showing an external appearance of an application example 3.

FIG. 23 shows an external view of a television receiver to which the display unit according to any of the above-described embodiments is applicable. This television receiver has, for example, an image display screen section 300 including a front panel 310 and a filter glass 320, and the image display screen section 300 is composed of the display unit according to any of the above-described embodiments.

Application Example 4

Figure 24A:
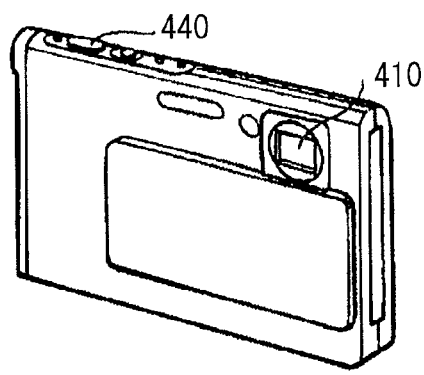
Figure 24B:
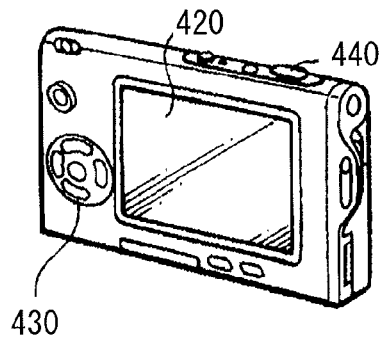
FIG. 24B is a perspective view showing an external appearance that is viewed from the rear side.

Each of FIG. 24A and FIG. 24B shows an external view of a digital camera to which the display unit according to any of the above-described embodiments is applicable. This digital camera has, for example, a light emitting section 410 for flashing, a display section 420, a menu switch 430, and a shutter button 440, and the display section 420 is composed of the display unit according to any of the above-described embodiments.

Application Example 5

Figure 25:
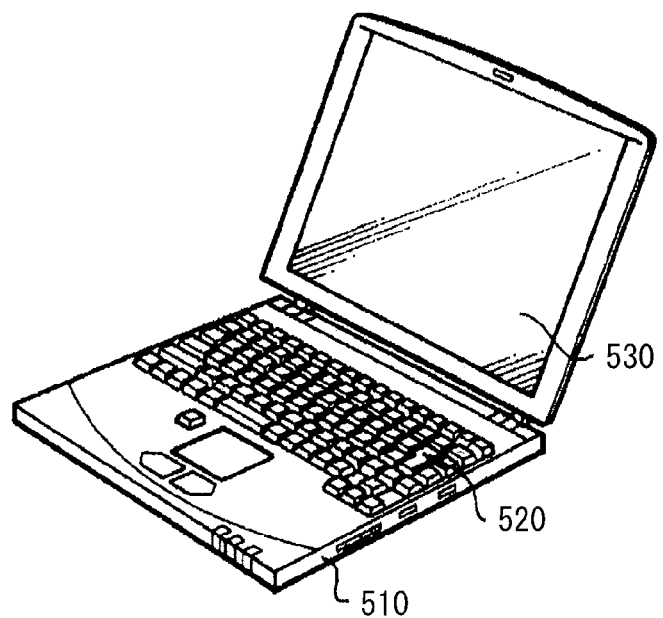
FIG. 25 is a perspective view showing an external appearance of an application example 5.

FIG. 25 shows an external view of a notebook personal computer to which the display unit according to any of the above-described embodiments is applicable. This notebook personal computer has, for example, a main body 510, a keyboard 520 for operation of entering characters and the like, and a display section 530 for image display, and the display section 530 is composed of the display unit according to any of the above-described embodiments.

Application Example 6

Figure 26:
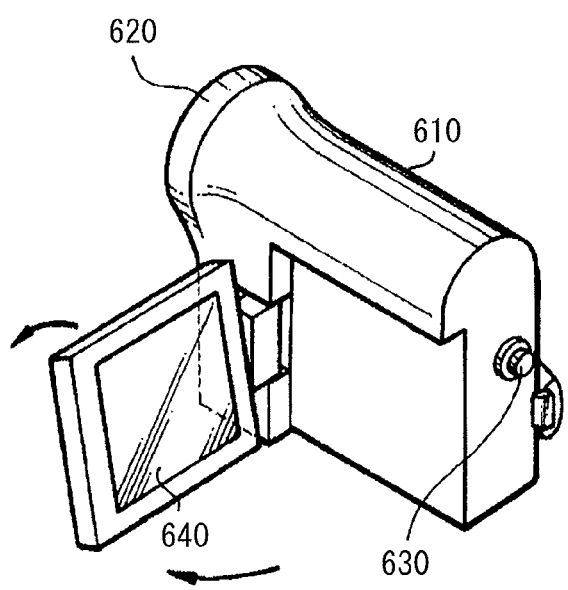
FIG. 26 is a perspective view showing an external appearance of an application example 6.

FIG. 26 shows an external view of a video camera to which the display unit according to any of the above-described embodiments is applicable. This video camera has, for example, a main body section 610, a lens 620 for capturing an image of a subject, that is provided at the front lateral side of the main body section 610, a start/stop switch 630 used at the time of capturing, and a display section 640, and the display section 640 is composed of the display unit according to any of the above-described embodiments.

Application Example 7

Each of FIG. 27A to FIG. 27G shows an external view of a cellular phone to which the display unit according to any of the above-described embodiments is applicable. For example, this cellular phone is configured of an upper chassis 710 and a lower chassis 720 coupled to each other with a coupling section (hinge section) 730, and has a display 740, a sub-display 750, a picture light 760, and a camera 770. The display 740 or the sub-display 750 is composed of the display unit according to any of the above-described embodiments.

The present technology is described hitherto with reference to the above-described embodiments, although the present technology is not limited thereto, but various modifications are available. For example, in the above-described embodiments, the description is provided on a case where the displacement direction A1 of the substrate 10 is a direction parallel to the joints 32, although the substrate 10 may be placed in an oscillation state in an oblique direction relative to the joints 32.

Further, in the above-described embodiments, the description is provided on a case where the joints 32 are provided in a direction (x-direction) orthogonal to a direction (y-direction) in which the divided portions 31 are arranged, although the joints 32 may be provided obliquely relative to y-direction, and the displacement direction A1 of the substrate 10 may be parallel to x-direction.

Moreover, in the above-described embodiments, the description is provided on a case where the film deposition is performed while oscillating the substrate 10 in opposition to the divided target 30, although the film deposition may be performed while advancing the substrate 10 (pass through) on the divided target 30.

Additionally, for example, the materials and thicknesses of each layer, or film deposition methods, film deposition conditions and the like that are described in the above-described embodiments are not limited thereto, but any other materials and thicknesses may be applicable, or any other film deposition methods and conditions may be permitted.

Further, in the above-described embodiments, the configuration of the organic light-emitting elements 10R, 10G, and 10B is explained with concrete descriptions, although it is not necessary to provide all layers, and any other layers may be additionally provided.

Moreover, the present disclosure may be also applicable to display units using any other elements such as liquid crystal display element, inorganic electroluminescence element, and electrodeposition type or electrochromic type display element apart from the organic light-emitting element.

Additionally, in the above-described embodiments, the configuration of the display unit is explained with concrete descriptions, although it is not necessary to include all component parts, and any other component parts may be additionally provided.

Accordingly, it is possible to achieve at least the following configurations from the above-described example embodiments, the modifications, and the application examples of the disclosure.

(1) A method of manufacturing a display unit, the method including:

forming, on a substrate, a thin-film transistor having an oxide semiconductor layer; and forming, above the thin-film transistor, a display region that includes a plurality of display elements, wherein the oxide semiconductor layer is formed using a sputtering method in which a target and the substrate are opposed to each other, the target being made of an oxide semiconductor and including a plurality of divided portions that are jointed in a planar form, and a spacing interval between two joints that are formed by the plurality of divided portions and are side-by-side with one another of the target is equal to or less than a width of a luminance distribution arising in the display region in a direction substantially orthogonal to the joints.

(2) The method of manufacturing the display unit according to (1), wherein the oxide semiconductor layer is formed by oscillating or advancing the substrate in opposition to the target, and the spacing interval between the two joints that are side-by-side with one another of the target is equal to or less than the width of the luminance distribution arising in the display region in a direction substantially orthogonal to a direction in which the substrate is displaced in the oscillating or in the advancing.

(3) The method of manufacturing the display unit according to (1) or (2), wherein the spacing interval between the two joints that are side-by-side with one another of the target is about 40 mm or less.

(4) The method of manufacturing the display unit according to any one of (1) to (3), wherein the display element is an organic light-emitting element driven by the thin-film transistor.

(5) The method of manufacturing the display unit according to any one of (1) to (3), wherein the display element is a liquid crystal display element driven by the thin-film transistor.

(6) The method of manufacturing the display unit according to any one of (1) to (3), wherein the display element is an electrophoretic display element driven by the thin-film transistor.

The present disclosure contains subject matter related to that disclosed in Japanese Priority Patent Application JP 2011-221980 filed in the Japan Patent Office on Oct. 6, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a display unit, the method comprising:

forming, on a substrate, a thin-film transistor having an oxide semiconductor layer; and forming, above the thin-film transistor, a display region that includes a plurality of display elements, wherein, the oxide semiconductor layer is formed using a sputtering method in which a target and the substrate are opposed to each other, the target being made of an oxide semiconductor and including a plurality of divided portions that are jointed in a planar form, and a spacing interval between two joints that are formed by the plurality of divided portions and are side-by-side with one another of the target is equal to or less than a width of a luminance distribution arising in the display region in a direction substantially orthogonal to the joints.

2. The method of manufacturing the display unit according to claim 1, wherein:

the oxide semiconductor layer is formed by oscillating or advancing the substrate in opposition to the target, and the spacing interval between the two joints that are side-by-side with one another of the target is equal to or less than the width of the luminance distribution arising in the display region in a direction substantially orthogonal to a direction in which the substrate is displaced in the oscillating or in the advancing.

3. The method of manufacturing the display unit according to claim 1, wherein the spacing interval between the two joints that are side-by-side with one another of the target is about 40 mm or less.

4. The method of manufacturing the display unit according to claim 1, wherein the display element is an organic light-emitting element driven by the thin-film transistor.

5. The method of manufacturing the display unit according to claim 1, wherein the display element is a liquid crystal display element driven by the thin-film transistor.

6. The method of manufacturing the display unit according to claim 1, wherein the display element is an electrophoretic display element driven by the thin-film transistor.

* * * * *